US008239152B2

(12) United States Patent
Itai

(10) Patent No.: US 8,239,152 B2
(45) Date of Patent: Aug. 7, 2012

(54) INFORMATION PROCESSING APPARATUS, INFORMATION PROCESSING METHOD, AND COMPUTER PROGRAM PRODUCT

(75) Inventor: Daisuke Itai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 303 days.

(21) Appl. No.: 12/036,499

(22) Filed: Feb. 25, 2008

(65) Prior Publication Data

US 2008/0208498 A1 Aug. 28, 2008

(30) Foreign Application Priority Data

Feb. 27, 2007 (JP) ................................. 2007-047881

(51) Int. Cl.
*G06F 19/00* (2011.01)

(52) U.S. Cl. ............................ 702/84; 702/108; 702/189

(58) Field of Classification Search .................... 702/84, 702/108, 189; 438/30, 142; 356/399–401; 355/67, 133; 250/252.1, 358.1, 372, 492.2; 257/E21.524

See application file for complete search history.

(56) References Cited

U.S. PATENT DOCUMENTS

| | | | | | |
|---|---|---|---|---|---|
| 5,528,043 | A | * | 6/1996 | Spivey et al. | 250/370.09 |
| 5,805,866 | A | * | 9/1998 | Magome et al. | 716/19 |
| 5,989,761 | A | * | 11/1999 | Kawakubo et al. | 430/22 |
| 6,163,030 | A | * | 12/2000 | Johnson et al. | 250/370.14 |
| 6,489,176 | B2 | * | 12/2002 | Ninomiya | 438/30 |
| 6,594,334 | B1 | * | 7/2003 | Ota | 378/34 |
| 2008/0215295 | A1 | * | 9/2008 | Shiraishi | 702/187 |
| 2009/0187379 | A1 | * | 7/2009 | Itai et al. | 702/179 |

FOREIGN PATENT DOCUMENTS

| | | |
|---|---|---|
| JP | 04-282820 A | 10/1992 |
| JP | 2000-243794 A | 9/2000 |

OTHER PUBLICATIONS

Chopra et al., "Control of Multiwalled Carbon Nanotube Diameter by Selective Growth on the Exposed Edge of a Thin Film Multilayer Structure", Aug. 30, 2002, pp. 1177-1181, vol. 2, No. 10, American Chemical Society.

O'Dette et al., "Optimization of Dry Etch Process Conditions for HgCdTe Detector Arrays", 1999, pp. 821-825, vol. 28, No. 6, Journal of Electronic Materials.

Saxena et al., "Test Structures and Analysis Techniques for Estimation of the Impact of Layout on MOSFET Performance and Variability" Conference on Microelectronic Test Structures, Mar. 2004, vol. 17.

* cited by examiner

*Primary Examiner* — Michael Nghiem
*Assistant Examiner* — Elias Desta
(74) *Attorney, Agent, or Firm* — Canon USA Inc. IP Division

(57) ABSTRACT

An information processing apparatus processes information generated by an exposure apparatus. The information processing apparatus includes a collecting unit and a converting unit. The collecting unit collects first apparatus information obtained by the exposure apparatus via an operation of the exposure apparatus with respect to each of a plurality of first regions which form a first array defined on a substrate. The converting unit converts at least part of the first apparatus information collected by the collecting unit into second apparatus information with respect to each of a plurality of second regions which form a second array.

7 Claims, 22 Drawing Sheets

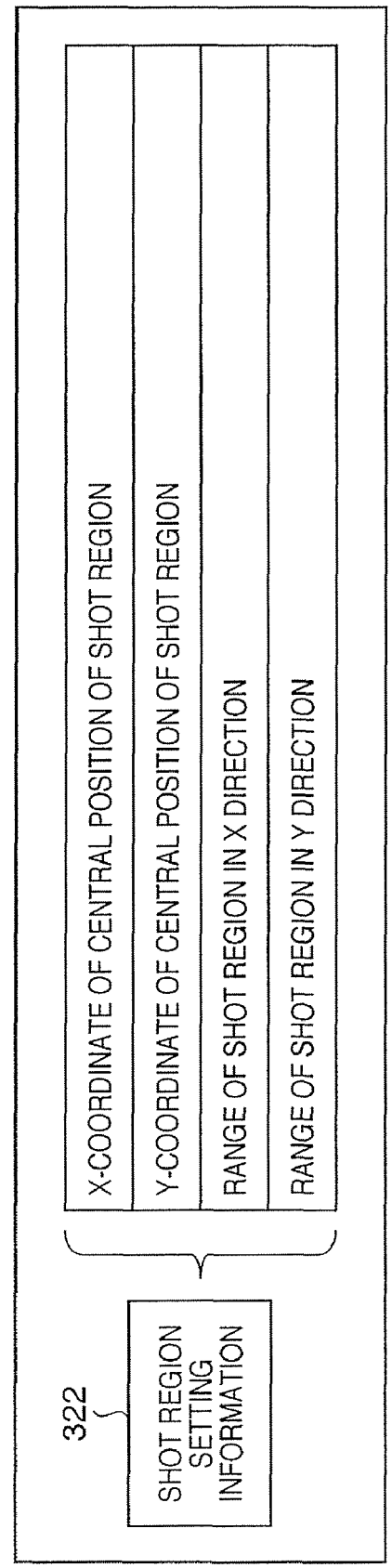

FIG. 3E

| Shot Region Exposure Control Result (324) | |
|---|---|
| MAXIMUM VALUE OF FOCUS/LEVELING MEASUREMENT VALUE IN SHOT REGION | MAXIMUM VALUE OF MA IN X DIRECTION IN SHOT REGION |
| MINIMUM VALUE OF FOCUS/LEVELING MEASUREMENT VALUE IN SHOT REGION | MINIMUM VALUE OF MA IN X DIRECTION IN SHOT REGION |
| AVERAGE OF FOCUS/LEVELING MEASUREMENT VALUE IN SHOT REGION | AVERAGE OF MA IN X DIRECTION IN SHOT REGION |
| STANDARD DEVIATION OF FOCUS/LEVELING MEASUREMENT VALUE IN SHOT REGION | STANDARD DEVIATION OF MA IN X DIRECTION IN SHOT REGION |
| MAXIMUM VALUE OF X MEASUREMENT VALUE IN SHOT REGION | MAXIMUM VALUE OF MA IN Y DIRECTION IN SHOT REGION |
| MINIMUM VALUE OF X MEASUREMENT VALUE IN SHOT REGION | MINIMUM VALUE OF MA IN Y DIRECTION IN SHOT REGION |
| AVERAGE OF X MEASUREMENT VALUE IN SHOT REGION | AVERAGE OF MA IN Y DIRECTION IN SHOT REGION |
| STANDARD DEVIATION OF X MEASUREMENT VALUE IN SHOT REGION | STANDARD DEVIATION OF MA IN Y DIRECTION IN SHOT REGION |
| MAXIMUM VALUE OF Y MEASUREMENT VALUE IN SHOT REGION | MAXIMUM VALUE OF MA IN θ DIRECTION IN SHOT REGION |
| MINIMUM VALUE OF Y MEASUREMENT VALUE IN SHOT REGION | MINIMUM VALUE OF MA IN θ DIRECTION IN SHOT REGION |
| AVERAGE OF Y MEASUREMENT VALUE IN SHOT REGION | AVERAGE OF MA IN θ DIRECTION IN SHOT REGION |
| STANDARD DEVIATION OF Y MEASUREMENT VALUE IN SHOT REGION | STANDARD DEVIATION OF MA IN θ DIRECTION IN SHOT REGION |
| MAXIMUM VALUE OF FOCUS/LEVELING FOLLOWABILITY IN SHOT REGION | MAXIMUM VALUE OF MSD IN X DIRECTION IN SHOT REGION |
| MINIMUM VALUE OF FOCUS/LEVELING FOLLOWABILITY IN SHOT REGION | MINIMUM VALUE OF MSD IN X DIRECTION IN SHOT REGION |
| AVERAGE OF FOCUS/LEVELING FOLLOWABILITY IN SHOT REGION | AVERAGE OF MSD IN X DIRECTION IN SHOT REGION |
| STANDARD DEVIATION OF FOCUS/LEVELING FOLLOWABILITY IN SHOT REGION | STANDARD DEVIATION OF MSD IN X DIRECTION IN SHOT REGION |
| MAXIMUM VALUE OF X FOLLOWABILITY IN SHOT REGION | MAXIMUM VALUE OF MSD IN Y DIRECTION IN SHOT REGION |
| MINIMUM VALUE OF X FOLLOWABILITY IN SHOT REGION | MINIMUM VALUE OF MSD IN Y DIRECTION IN SHOT REGION |
| AVERAGE OF X FOLLOWABILITY IN SHOT REGION | AVERAGE OF MSD IN Y DIRECTION IN SHOT REGION |
| STANDARD DEVIATION OF X FOLLOWABILITY IN SHOT REGION | STANDARD DEVIATION OF MSD IN Y DIRECTION IN SHOT REGION |
| MAXIMUM VALUE OF Y FOLLOWABILITY IN SHOT REGION | MAXIMUM VALUE OF MSD IN θ DIRECTION IN SHOT REGION |
| MINIMUM VALUE OF Y FOLLOWABILITY IN SHOT REGION | MINIMUM VALUE OF MSD IN θ DIRECTION IN SHOT REGION |
| AVERAGE OF Y FOLLOWABILITY IN SHOT REGION | AVERAGE OF MSD IN θ DIRECTION IN SHOT REGION |
| STANDARD DEVIATION OF Y FOLLOWABILITY IN SHOT REGION | STANDARD DEVIATION OF MSD IN θ DIRECTION IN SHOT REGION |

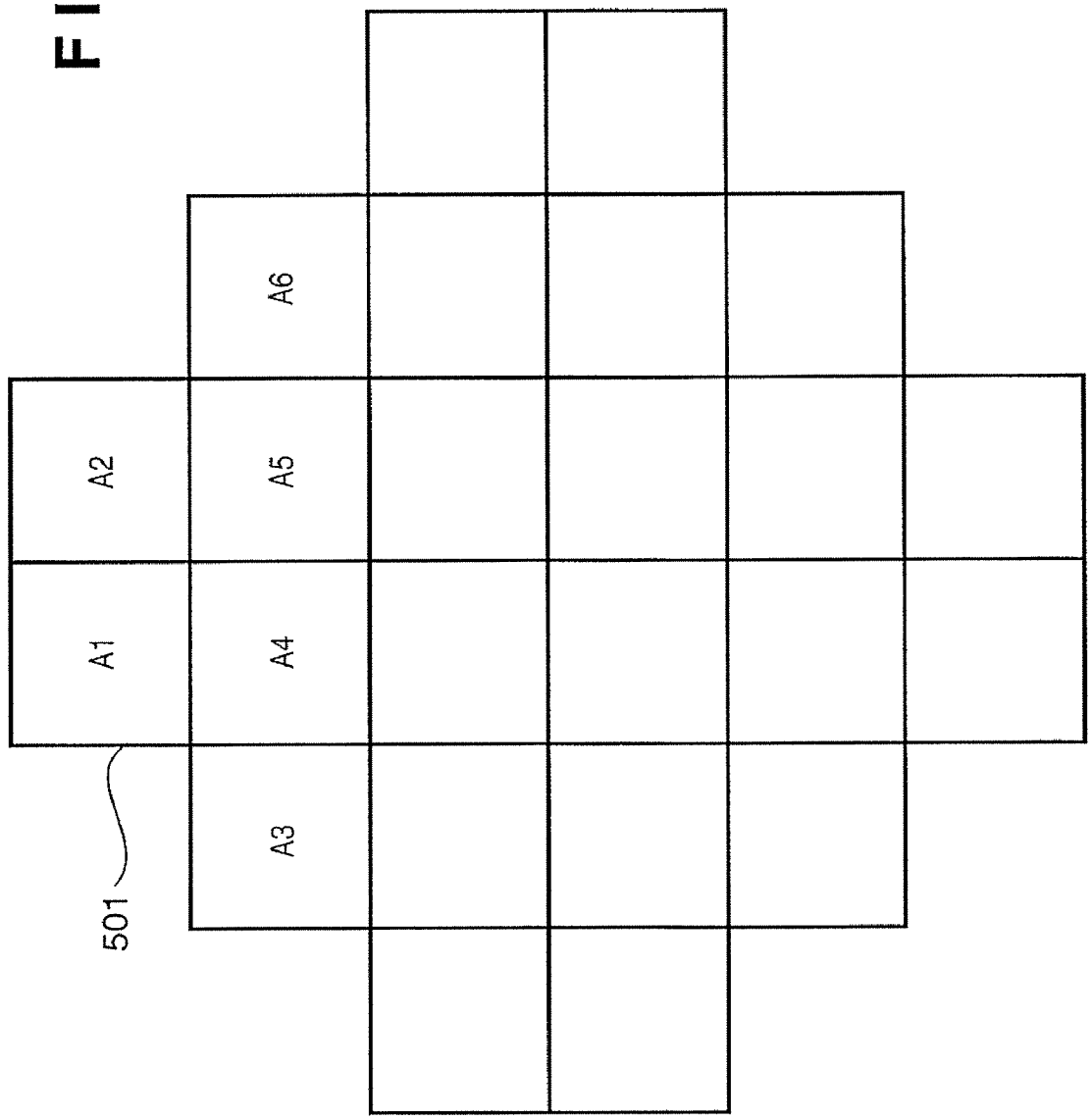

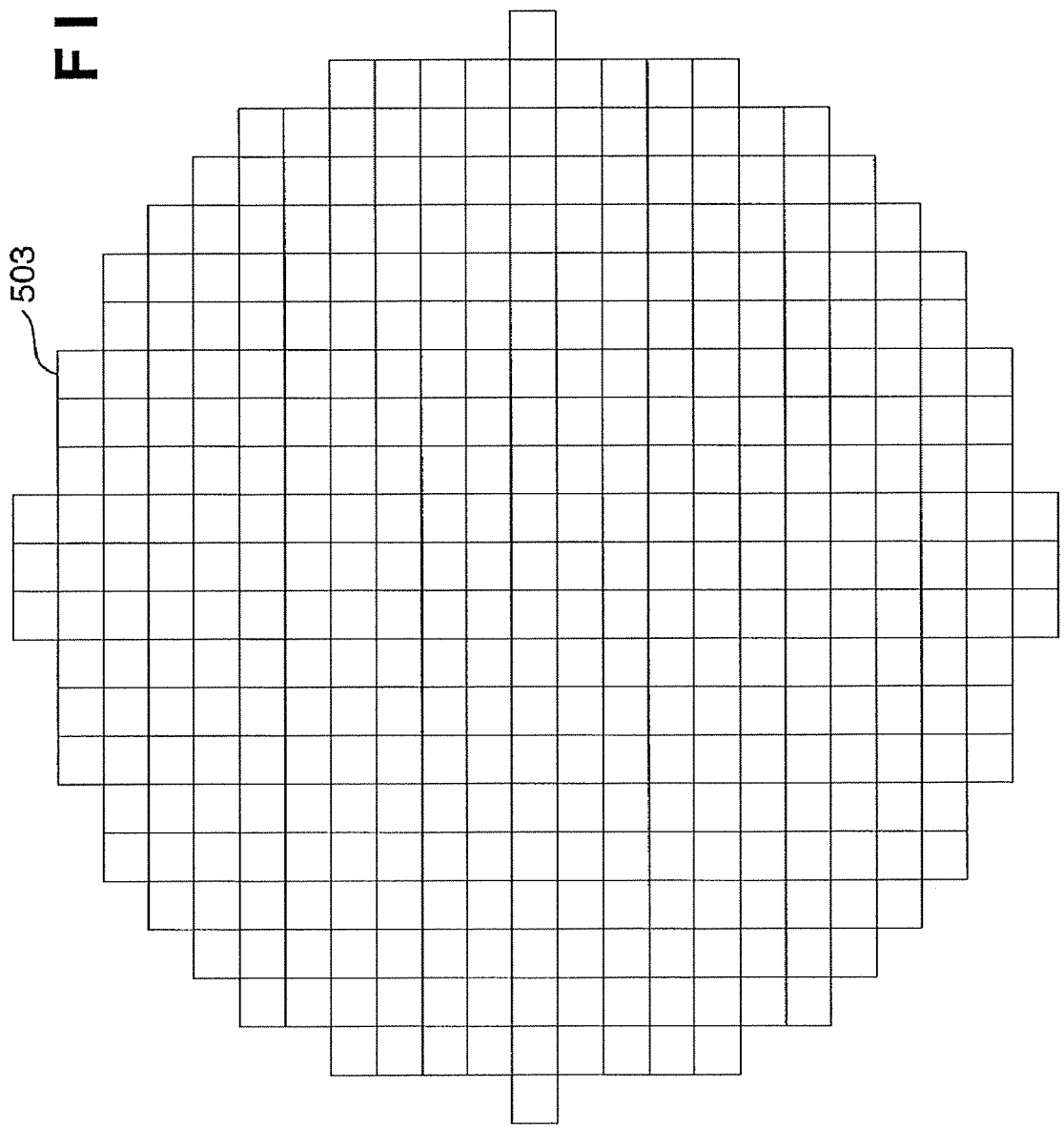

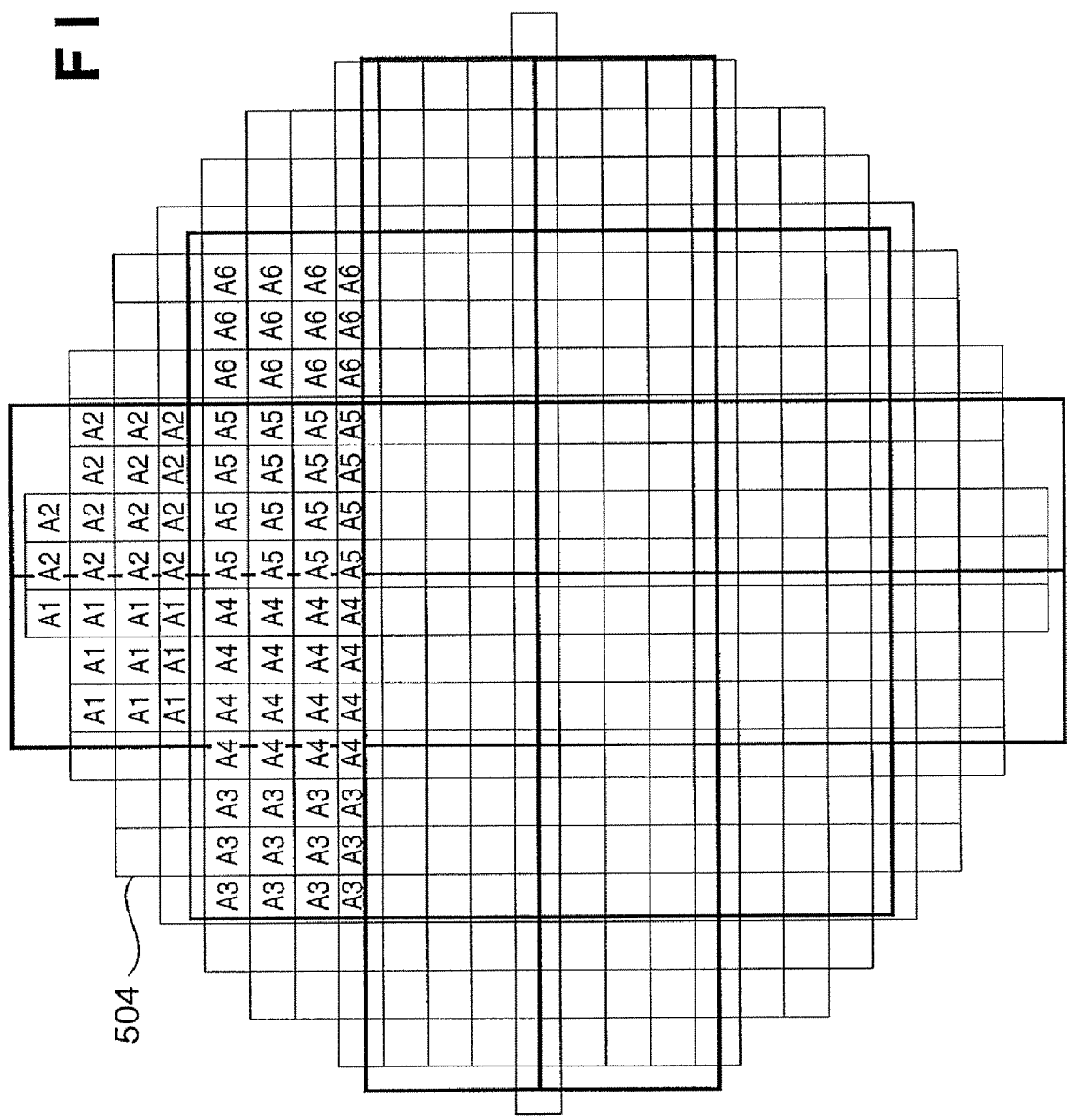

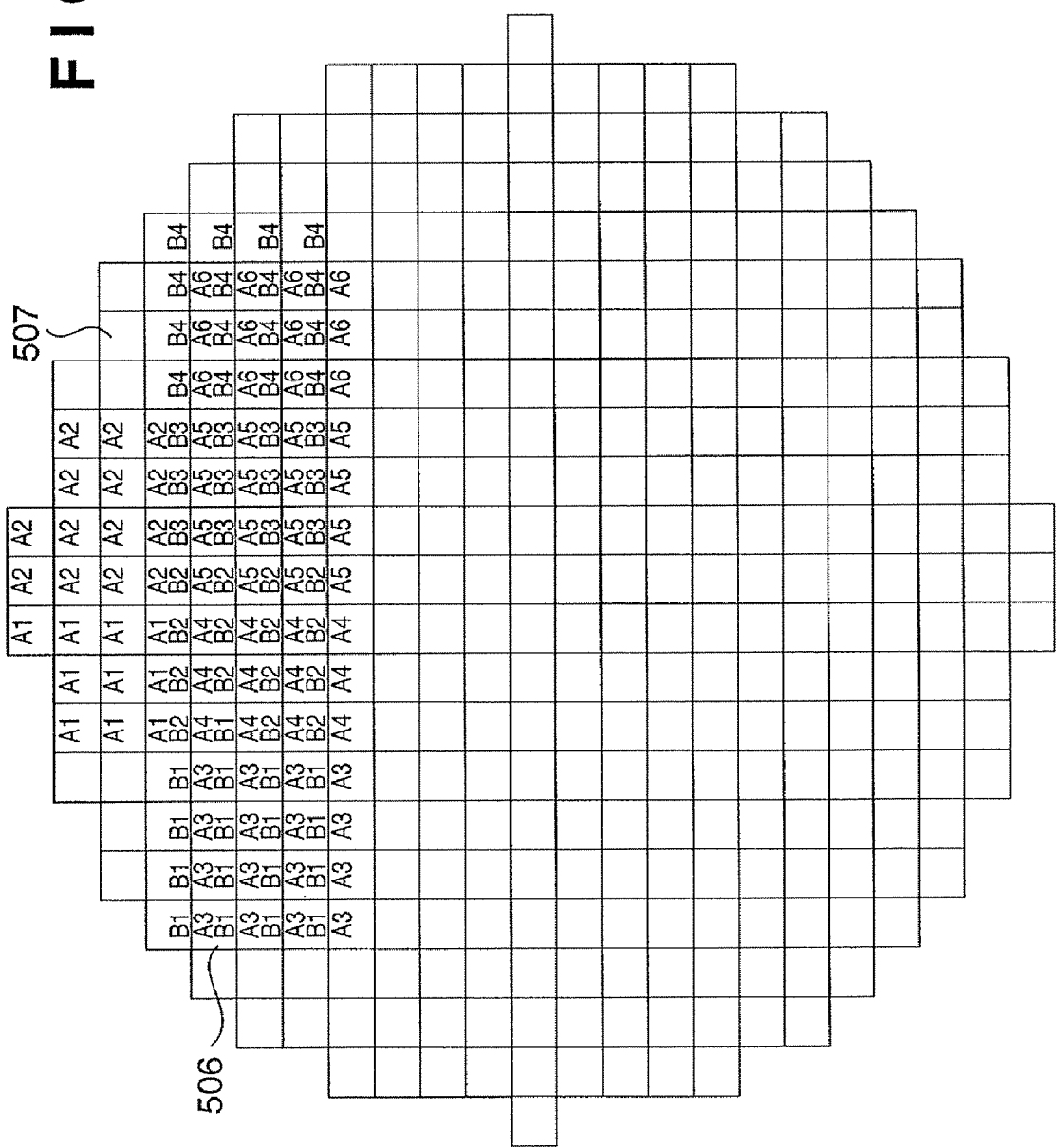

INFORMATION PROCESSING APPARATUS, INFORMATION PROCESSING METHOD, AND COMPUTER PROGRAM PRODUCT

CROSS REFERENCE TO RELATED APPLICATIONS

This application claims the benefit of Japanese Patent Application No. 2007-047881, filed Feb. 27, 2007, which is hereby incorporated by reference herein in its entirety.

BACKGROUND OF THE INVENTION

1. Field of the Invention

The present invention relates to an information processing apparatus, information processing method, and program product for processing information generated by an exposure apparatus.

2. Description of the Related Art

In manufacturing a semiconductor device, it is constantly demanded to improve the resolving power of a pattern and the overlay accuracy. In recent years, as the shortening of the exposure light wavelength is approaching a limit, a demand for a high-performance exposure apparatus is increasing.

Since the life cycles of electronic devices have shortened over time, the production mode is naturally shifting to high-variety, low-volume production for which trial production must be performed and commercial production must begin within a short period of time. To improve the productivity even in the high-variety, low-volume production, it is demanded to decrease the fraction of defective products.

To meet the above-described demands, it is necessary to know errors for their respective factors classified into apparatus, process, wafer, and shot factors, detect an abnormality at the shot level, and detect a temporal change in abnormality. These results are fed back to an apparatus, production process, and even a design pattern, thereby promising an improvement in productivity from a total point of view.

At present, however, data measured by exposure apparatuses during production cannot serve to uniformly compare and determine their performances from a difference in operating parameter or shot region array. To confirm the apparatus performance, an evaluation exposure job is executed using a common parameter and standard shot region array and various data involved are measured in this job. An inspection method of this kind must be executed after stopping the production of a semiconductor device, resulting in a waste of production time.

SUMMARY OF THE INVENTION

The present invention has been made based on the above-described situation, and has as its exemplary object to effectively use information obtained by an exposure apparatus via an operation thereof.

According to the first aspect of the present invention, there is provided an information processing apparatus for processing information generated by an exposure apparatus which exposes a substrate to radiant energy. The information processing apparatus comprises a collecting unit configured to collect first apparatus information obtained by the exposure apparatus via an operation thereof with respect to each of a plurality of first regions which form a first array defined on the substrate, and a converting unit configured to convert at least a part of the first apparatus information collected with respect to each of the plurality of first regions by the collecting unit into second apparatus information with respect to each of a plurality of second regions which form a second array.

According to the second aspect of the present invention, there is provided an exposure system comprising an exposure apparatus configured to expose a substrate to radiant energy, and the above information processing apparatus for processing information generated by the exposure apparatus.

According to the third aspect of the present invention, there is provided a method of processing information generated by an exposure apparatus which exposes a substrate to radiant energy. The method comprises a collection step of collecting first apparatus information obtained by the exposure apparatus via an operation thereof with respect to each of a plurality of first regions which form a first array defined on the substrate, and a conversion step of converting at least a part of the first apparatus information collected with respect to each of the plurality of first regions in the collection step into second apparatus information with respect each of a plurality of second regions which form a second array.

According to the fourth aspect of the present invention, there is provided a computer program product for causing a computer to process information generated by an exposure apparatus which exposes a substrate to radiant energy. The product causes the computer to execute a collection step of collecting first apparatus information obtained by the exposure apparatus via an operation thereof with respect to each of a plurality of first regions which form a first array defined on the substrate, and a conversion step of converting at least a part of the first apparatus information collected with respect to each of the plurality of first regions in the collection step into second apparatus information with respect to each of a plurality of second regions which form a second array.

According to the present invention, it is possible to efficiently use information obtained by the exposure operation of, for example, an exposure apparatus.

Further features of the present invention will become apparent from the following description of exemplary embodiments with reference to the attached drawings.

BRIEF DESCRIPTION OF THE DRAWINGS

FIGS. 3A to 3E are views showing an example of one shot region information collected by an information collecting unit;

FIGS. 5A to 5F are views schematically showing the first example of conversion processing by the converting unit;

DESCRIPTION OF THE EMBODIMENTS

Figure 1:
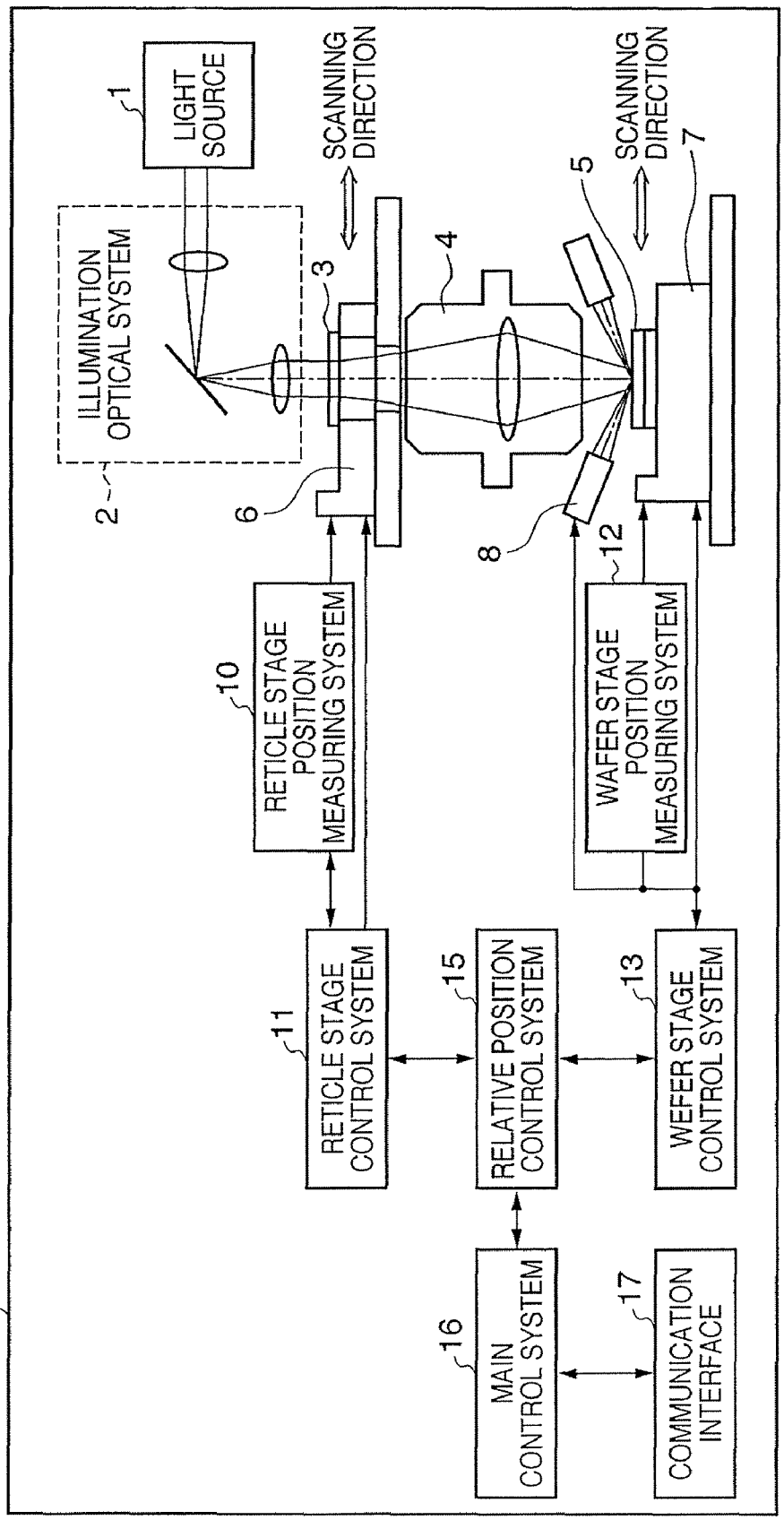
FIG. 1 is a block diagram schematically showing the arrangement of an exposure apparatus according to a preferred embodiment of the present invention.

FIG. 1 is a block diagram schematically showing the arrangement of an exposure apparatus according to a preferred embodiment of the present invention. An exposure apparatus 100 according to this embodiment is of a scanning type. However, the exposure apparatus according to the present invention is not particularly limited to a scanning exposure apparatus.

In the exposure apparatus 100, a light beam emitted by a light source 1 is shaped into a slit via an illumination optical system 2, undergoes light intensity distribution adjustment, and illuminates a reticle 3 held by a reticle stage 6. The pattern of the reticle 3 is transferred onto a wafer (substrate) 5 which is coated with a photosensitive agent (resist) and held by a wafer stage 7. With this operation, a latent image pattern is formed on the photosensitive agent. The latent image pattern is developed into a mask pattern (resist pattern) in a development process.

The illumination optical system 2 can comprise an aperture stop such as an aperture stop including a plurality of circular apertures having different areas to set the value of a coherence factor σ. The illumination optical system 2 can also comprise a ring-like stop for zonal illumination, a quadrupolar stop, and a mechanism (e.g., a plurality of ND filters and a mechanism for switching between them) for adjusting the illumination light intensity. The illumination optical system 2 can also comprise a light intensity detector for measuring the light intensity, a blind inserted at a position conjugate to the reticle 3 to ensure a slit-like illumination range, and a driving mechanism for driving it. A projection optical system 4 can comprise a numerical aperture setting mechanism for setting the numerical aperture, and a lens driving mechanism for correcting the aberration.

Light which illuminates a slit-like illumination region of the pattern of the reticle 3 and is reflected by it is projected onto the wafer 5 via the projection optical system 4. The position of the reticle stage 6 (as a result, the reticle 3) is measured by a reticle stage position measuring system 10 and controlled by a reticle stage control system 11.

The position of the wafer 5 can be measured by a wafer stage position measuring system 12 and focus/leveling measuring system 14. The wafer stage position measuring system 12 measures, for example, the position of the wafer 5 in the optical axis direction (i.e., the Z direction) of the projection optical system 4, two orthogonal axial directions (i.e., the X and Y directions) in a plane perpendicular to the optical axis, and rotational directions about the X-, Y-, and Z-axes. The focus/leveling measuring system 14 measures the surface position of the wafer 5 in the optical axis direction (Z direction) of the projection optical system 4. The focus/leveling measuring system 14 can measure the surface position of the wafer 5 in exposing it. A wafer stage control system 13 controls the position of the wafer stage 7 based on the pieces of information provided from the wafer stage position measuring system 12 and focus/leveling measuring system 14. The measurement value obtained by the focus/leveling measuring system 14 will be referred to as a focus/leveling measurement value hereinafter. The exposure apparatus 100 may also comprise a measuring system for measuring the position of the reticle stage 6 (reticle 3) in the optical axis direction of the projection optical system 4.

To transfer the entire pattern of the reticle 3 with a slit-like illumination light beam onto the wafer 5, the reticle 3 held by the reticle stage 6 is driven in the "scanning direction" shown in FIG. 1. At the same time, the wafer 5 held by the wafer stage 7 is also driven in the "scanning direction" shown in FIG. 1. The reticle 3 and wafer 5 are driven at a speed ratio matching the projection magnification of the projection optical system 4. If the relative position between the reticle 3 and the wafer 5 shifts, a deformed pattern is transferred onto the wafer 5. To avoid this situation, a relative position control system 15 calculates the relative positional shift between the reticle 3 and the wafer 5, and controls the reticle stage control system 11 and wafer stage control system 13 so that it becomes zero.

A main control system 16 controls constituent elements of the exposure apparatus 100, such as the relative position control system 15, reticle stage control system 11, wafer stage control system 13, and illumination optical system 2.

The scanning exposure operation of the exposure apparatus 100 will be explained. First, the main control system 16 acquires setting parameters which define the exposure operation of the exposure apparatus 100 via a communication interface 17. The setting parameters include the position of each shot region, the exposure field angle (the dimension of each shot region), the exposure scanning speed, the exposure scanning direction, the target focus/leveling value, and the target shot alignment value.

Next, the main control system 16 controls the constituent elements of the exposure apparatus 100 based on the above-described setting parameters, and exposes a plurality of shot regions on the wafer by a step & scan scheme.

The main control system 16 has a function of transmitting design-dependent apparatus information (first apparatus information) indicating the performance of the exposure apparatus 100 in the scanning exposure operation for each shot region to an information processing apparatus 202 (to be described later) via the communication interface 17. The design-dependent apparatus information (first apparatus information) can contain a plurality of pieces of shot region information (first region information) obtained by exposing a plurality of shot regions which form a shot region array (first array) defined on the wafer. The shot region array can be defined for each device to be manufactured, in accordance with its design pattern (e.g., its dimension), that is, its process. Each shot region information contains information associated with the control of the exposure apparatus 100, such as the synchronization accuracy, focus/leveling measurement value, and focus/leveling followability. The synchronization accuracy is information associated with the accuracy of synchronously moving (synchronously scanning) the reticle 3 (reticle stage 6) and the wafer 5 (wafer stage 7) in the scanning exposure operation. Information associated with a following error (X, Y) of the reticle stage 6 with respect to the wafer stage 7 in the scanning exposure can be obtained based on the positional information of the reticle stage 6 and wafer stage 7 in exposing each shot region on the wafer 5. Based on this information, the moving average (MA) and moving standard deviation (MSD) can be calculated as the synchronization accuracy.

The focus/leveling measurement value is information indicating the position or shape of the wafer surface. The focus/ leveling followability is an error of the focus/leveling measurement value with respect to the target focus/leveling position.

Figure 2:
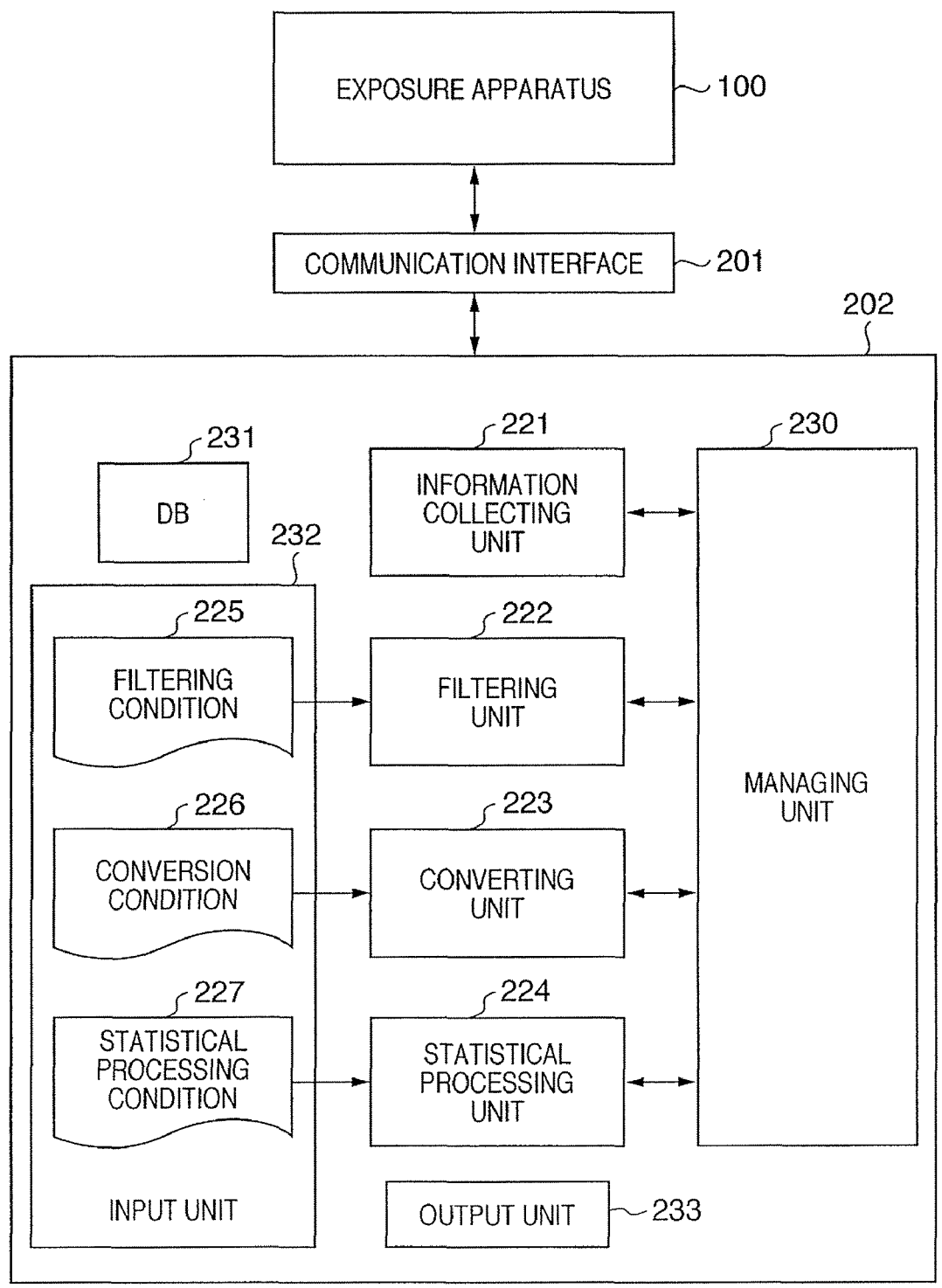
FIG. 2 is a block diagram schematically showing the configuration of an exposure system according to the preferred embodiment of the present invention.

FIG. 2 is a block diagram schematically showing the configuration of an exposure system according to the preferred embodiment of the present invention. The exposure system can comprise the exposure apparatus 100, and the information processing apparatus 202 connected to the exposure apparatus 100 via a communication interface 201. The information processing apparatus 202 can also serve as a managing apparatus or managing system which manages the exposure apparatus 100.

The information processing apparatus 202 is configured to process the design-dependent apparatus information (first apparatus information) provided from the exposure apparatus 100. When the information processing apparatus 202 has a specific function to be described hereinafter, it can be configured by, for example, installing a program in a general-purpose computer. By installing the program in the information processing apparatus 202, it operates as, for example, an apparatus which comprises a database 231, information collecting unit 221, filtering unit 222, converting unit 223, statistical processing unit 224, input unit 232, output unit 233, and managing unit 230. An information processing method executed by such an information processing apparatus can include an information collection step, filtering step, conversion step, statistical processing step, input step, output step, and management step.

The information collecting unit 221 collects the design-dependent apparatus information (first apparatus information) associated with the control of the exposure apparatus 100 via the communication interface 201, and stores it in the database (DB) 231.

The filtering unit 222 extracts information which meets a filtering condition 225 provided from the input unit 232 from the design-dependent apparatus information stored in the database 231, and provides the extracted information to the converting unit 223. The converting unit 223 converts the design-dependent apparatus information stored in the database 231 or the information extracted from the design-dependent apparatus information by the filtering unit 222 into standardized apparatus information (second apparatus information) in accordance with a conversion condition 226. That is, the converting unit 223 converts at least part of the first apparatus information collected by the information collecting unit 221 into standardized apparatus information (second apparatus information). The standardized apparatus information contains a plurality of pieces of standard region information (second region information) for a plurality of standard regions (second regions) which form a standard region array (second array). The conversion condition 226 can be provided from the input unit 232 to the converting unit 223. The conversion condition 226 includes, for example, the definition of the above-described second array.

Consider a case in which an exposure operation according to a first shot region array and that according to a second shot region array are executed. The converting unit 223 converts first design-dependent apparatus information obtained by the exposure operation according to the first shot region array into first standardized apparatus information according to a standard region array. The converting unit 223 also converts second design-dependent apparatus information obtained by the exposure operation according to the second shot region array into second standardized apparatus information according to the standard region array. The first standardized apparatus information contains a plurality of pieces of standard region information for a plurality of standard regions which form a second array. The second standardized apparatus information also contains a plurality of pieces of standard region information for the plurality of standard regions. Since both the pieces of standard region information of the first standardized apparatus information and those of the second standardized apparatus information are associated with common standard regions, they can be easily, statistically processed.

The statistical processing unit 224 statistically processes the plurality of pieces of standardized apparatus information converted by the converting unit 223. The output unit 233 includes, for example, a display device and/or storage device as an output device, and outputs the processing result obtained by the statistical processing unit 224 to the output device.

The managing unit 230 manages (controls) the constituent elements of the information processing apparatus 202, that is, the database 231, information collecting unit 221, filtering unit 222, converting unit 223, statistical processing unit 224, input unit 232, and output unit 233.

Figure 3A:
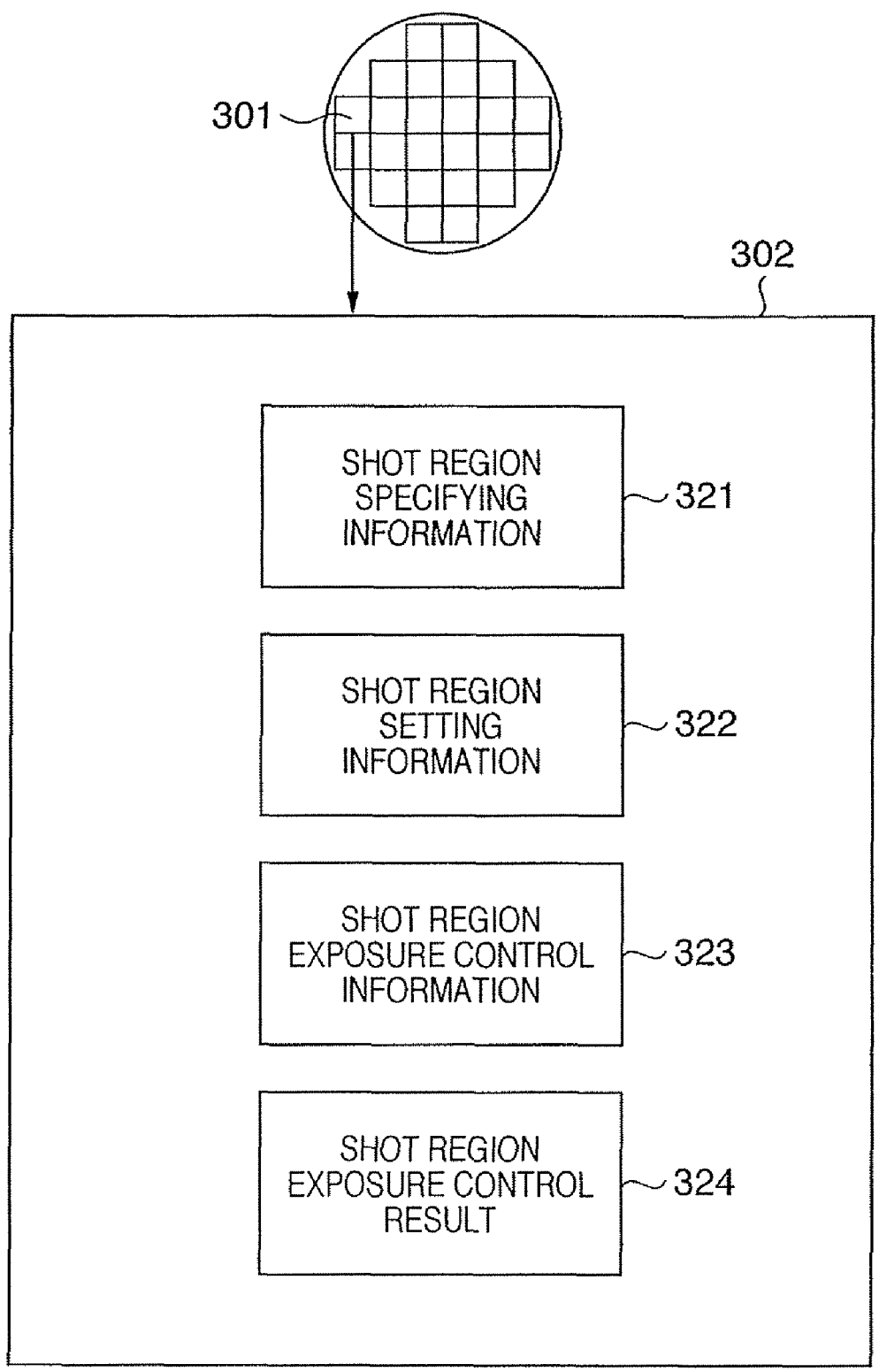
Figure 3B:
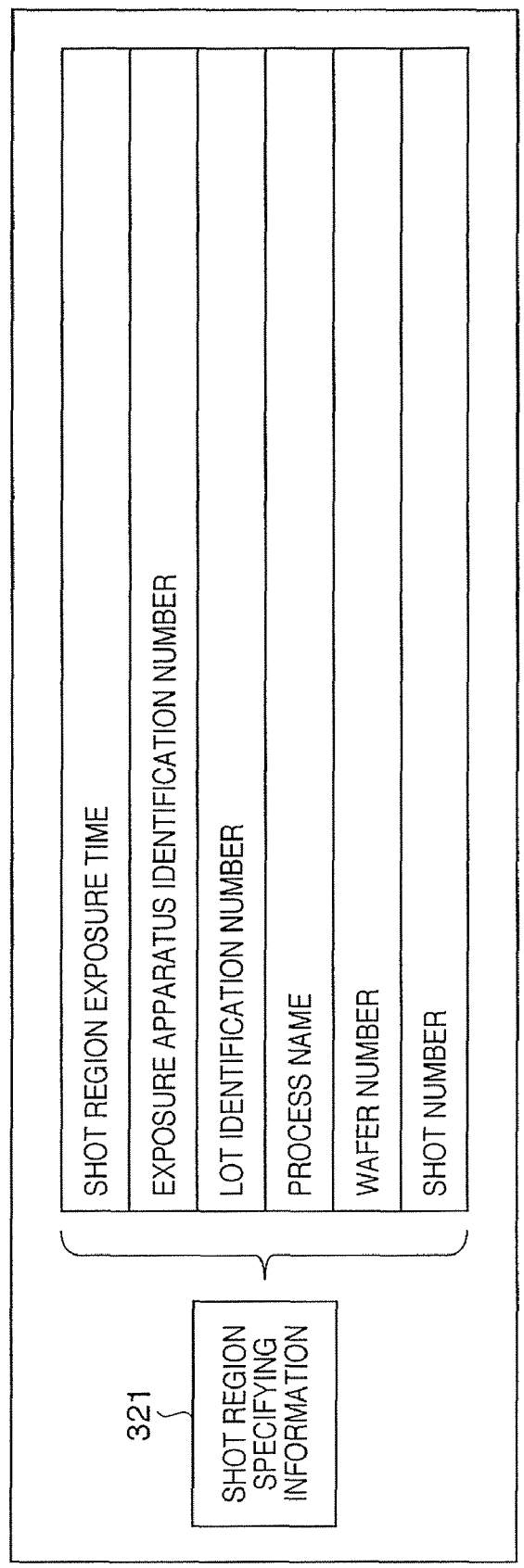
Figure 3D:
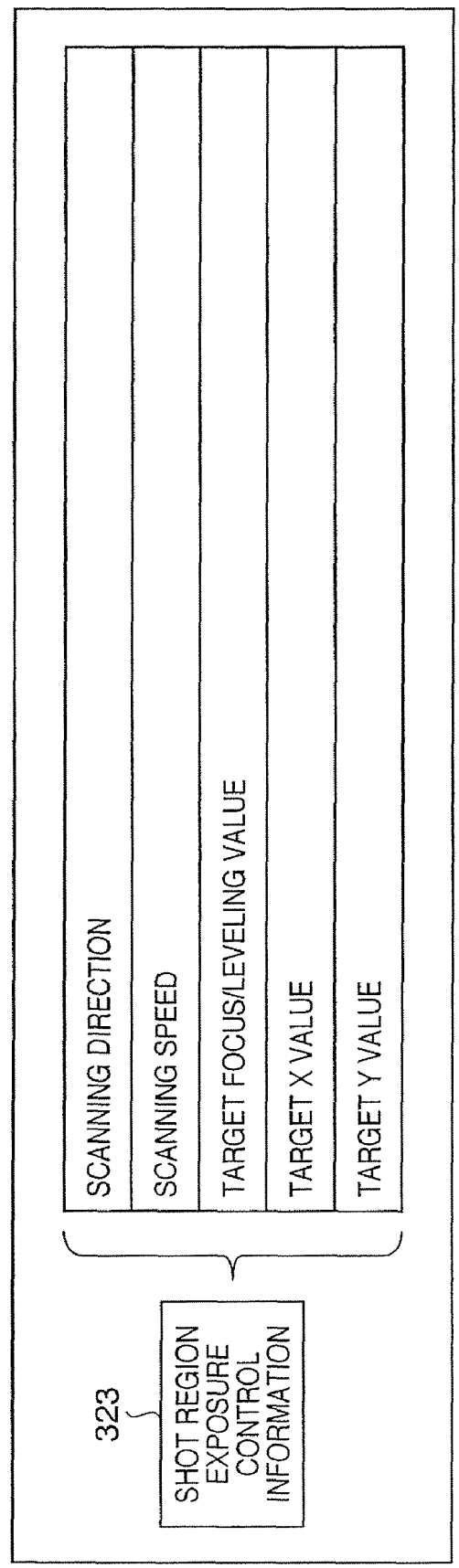

FIG. 3 is a view showing an example of one shot region information 302 collected by the information collecting unit 221. Since the design-dependent apparatus information contains pieces of shot region information 302 for the plurality of shot regions, it contains pieces of shot region information 302 the number of which is equal to that of the plurality of shot regions. Each piece of shot region information 302 can contain shot region specifying information 321, shot region setting information 322, shot region exposure control information 323, and a shot region exposure control result 324.

The shot region specifying information 321 contains, for example, the exposure apparatus identification number, lot identification number, process name, wafer number, and shot number.

The shot region setting information 322 contains, for example, the central position (X-coordinate) of a shot region, the central position (Y-coordinate) of the shot region, the range of the shot region in the X direction, and the range of the shot region in the Y direction.

The shot region exposure control information 323 contains, for example, the scanning direction, the scanning speed, the target focus/leveling value, the target X value (the target position in the X direction), and the target Y value (the target position in the Y direction).

The shot region exposure control result 324 can contain, e.g., the maximum value, minimum value, average, and standard deviation of the focus/leveling measurement value in a shot region. The control result 324 can also contain, e.g., the maximum values, minimum values, averages, and standard deviations of the X and Y measurement values in the shot region. The control result 324 can also contain, e.g., the maximum value, minimum value, average, and standard deviation of the focus/leveling followability in the shot region. The control result 324 can also contain, e.g., the maximum values, minimum values, averages, and standard deviations of the X and Y followabilities (the followability of position control in the X direction and that in the Y direction). The control result 324 can also contain, e.g., the maximum values, minimum values, averages, and standard deviations of the moving averages MA in the X, Y, and θ directions and the moving standard deviations MSD in the X, Y, and θ directions in the shot region.

Figure 4:
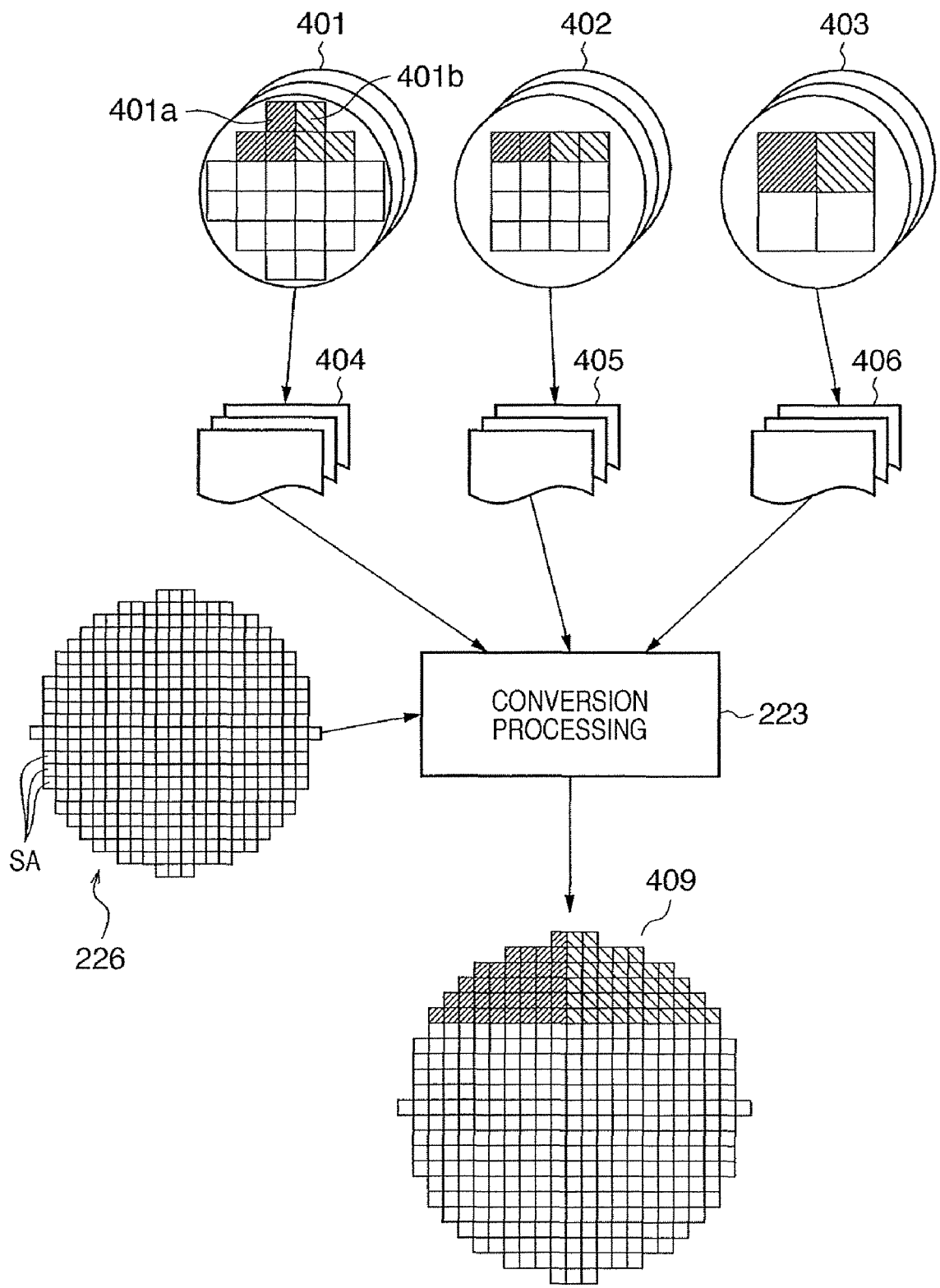
FIG. 4 is a view schematically showing an example of conversion processing by a converting unit.

FIG. 4 is a view schematically showing an example of conversion processing by the converting unit 223. Assume that exposure operations according to a plurality of design patterns 401, 402, and 403 having different shot region arrays are executed to obtain a plurality of pieces of exposure apparatus information 404, 405, and 406. The converting unit 223 receives a standard region array formed by a plurality of standard regions SA as the conversion condition 226.

The converting unit 223 converts pieces of information for a plurality of shot regions, which form exposure apparatus information, into pieces of standard region information for a plurality of standard regions which form a standard region array to generate standardized apparatus information 409.

Figure 5B:
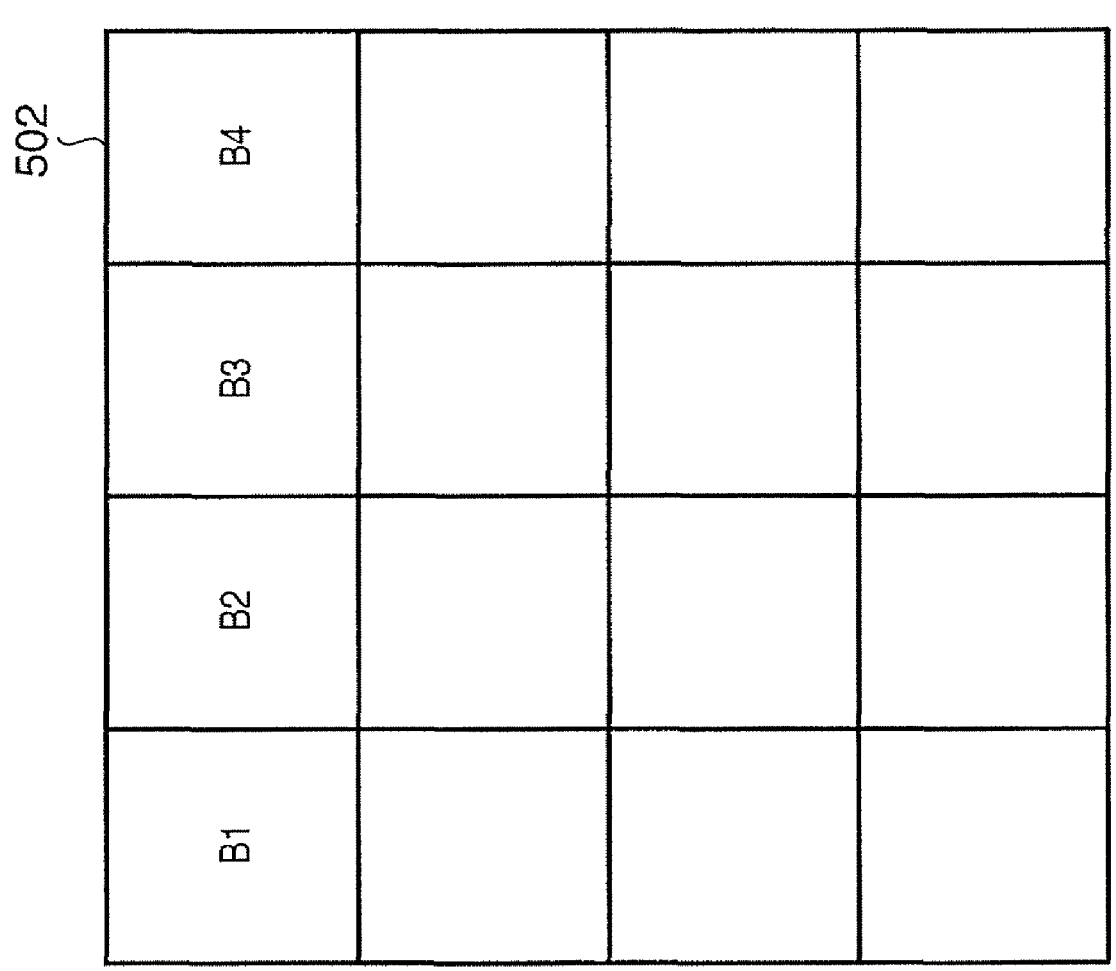
Figure 5E:
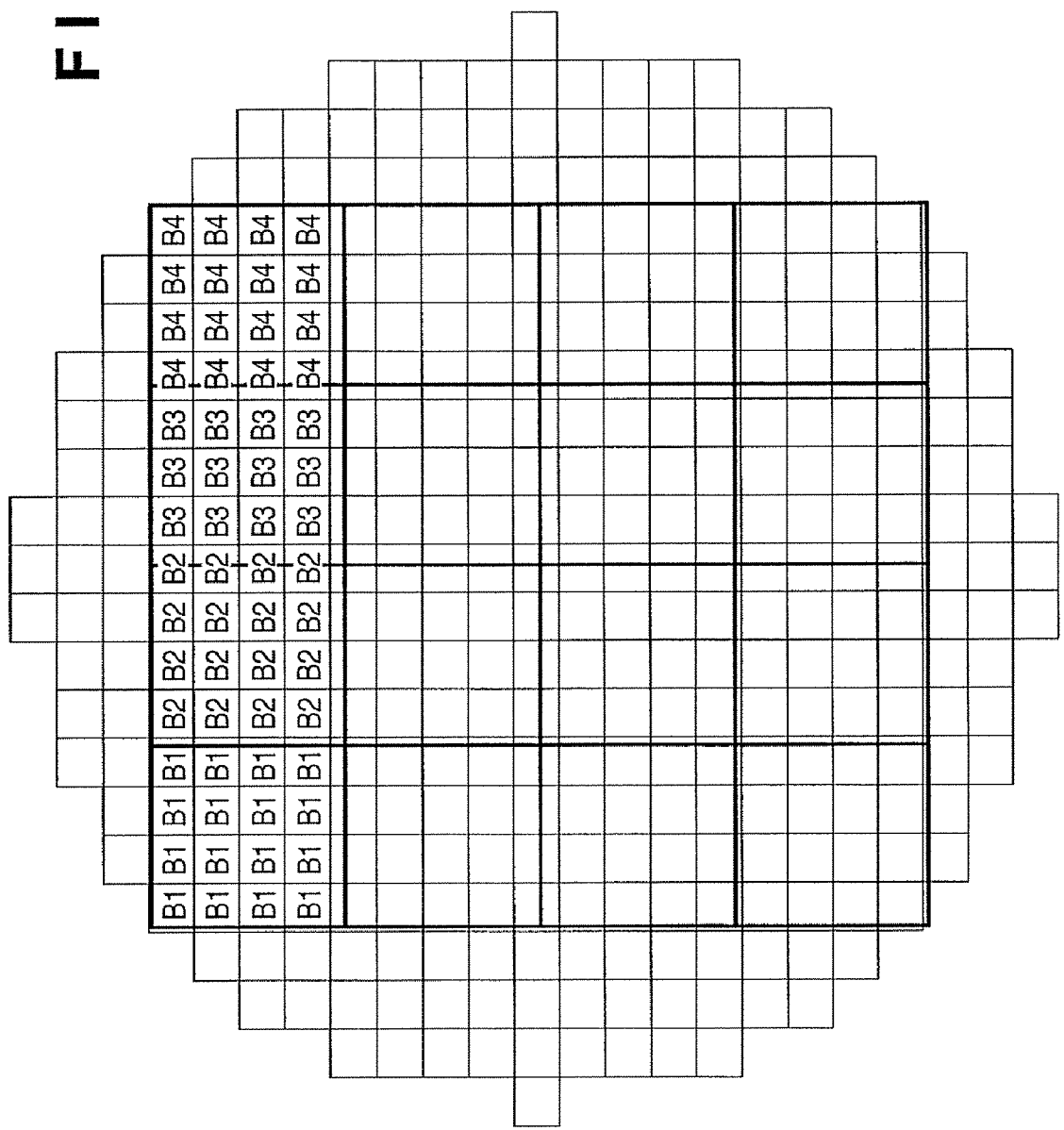

The converting unit 223 can execute conversion processing in accordance with various methods. FIGS. 5A to 5F are views schematically showing the first example of conversion processing by the converting unit 223. In the first example, information for a shot region including the central position of each standard region is used as information for each standard region which forms a standard region array. For example, pieces of shot region information A1 to A6, . . . for a plurality of shot regions arrayed as shown in FIG. 5A are converted as shown in FIG. 5D in accordance with a standard region array 503 as shown in FIG. 5C. For example, pieces of shot region information B1 to B4 . . . for a plurality of shot regions arrayed as shown in FIG. 5B are converted as shown in FIG. 5E in accordance with the standard region array 503 as shown in FIG. 5C.

The converting unit 223 converts design-dependent apparatus information obtained by exposure according to the shot region array illustrated in FIG. 5A and that obtained by exposure according to the shot region array illustrated in FIG. 5B to obtain standardized apparatus information as shown in FIG. 5F. For a standard region 506, two pieces of standard region information A3 and B1 are obtained and can be statistically processed. For a standard region 507 for which no standard region information is obtained, it is possible to generate pieces of standard region information based on pieces of standard region information for other standard regions, for example, its peripheral standard regions.

FIGS. 6A to 6F are views schematically showing the second example of the conversion processing by the converting unit 223. In the second example, information for each shot region which forms a shot region array is used as information for a standard region including the central position of the shot region.

Figure 6A:
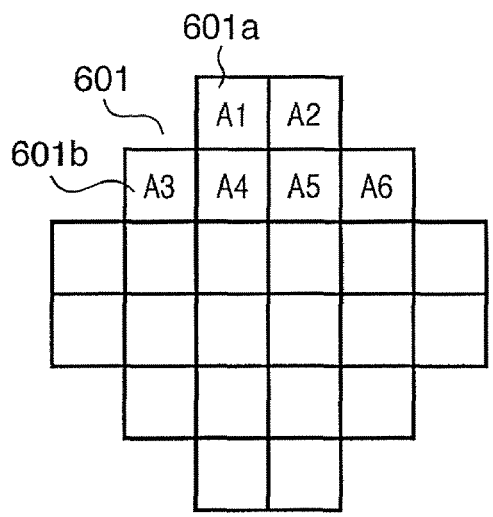
FIGS. 6A to 6F are views schematically showing the second example of the conversion processing by the converting unit.
Figure 6D:
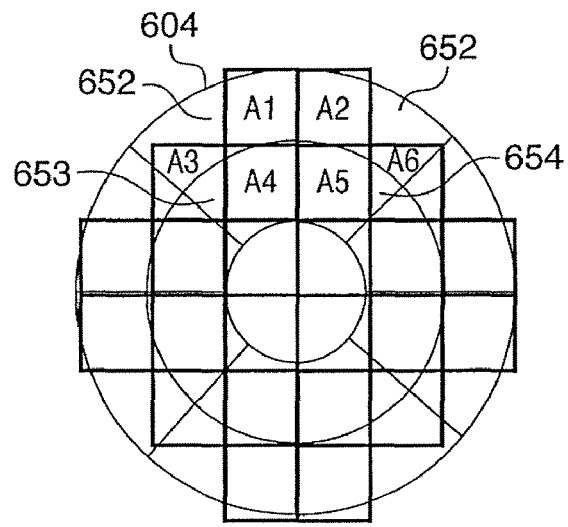
Figure 6B:
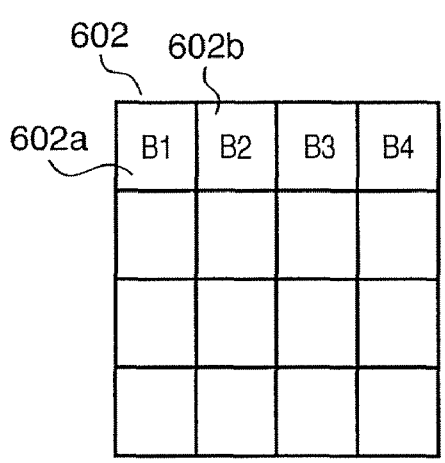
Figure 6E:
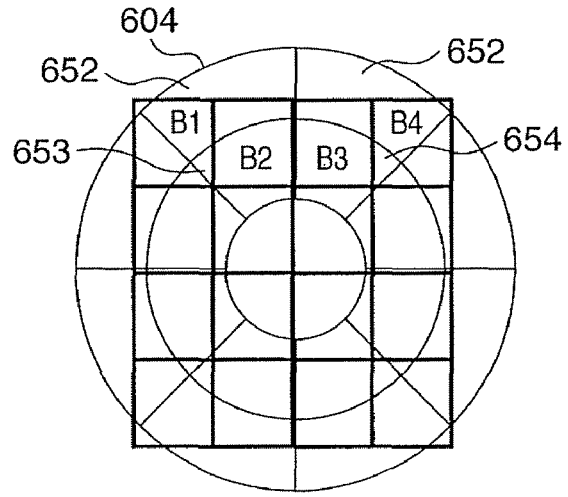
Figure 6C:
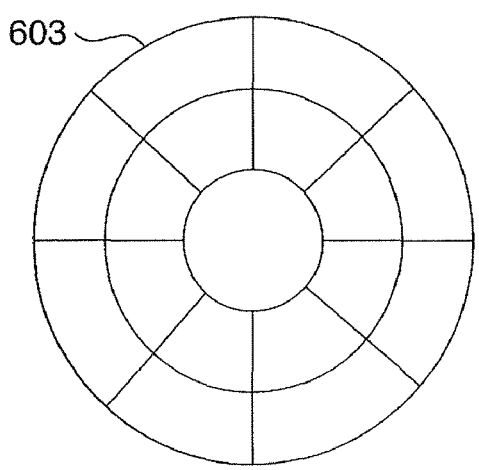

Assume, for example, a case in which exposure apparatus information is converted into pieces of standard region information using a standard region array 603 as shown in FIG. 6C. In this case, for example, pieces of information A1 and A3 for shot regions 601a and 601b of a shot region array as shown in FIG. 6A are used as information for a standard region 652 including the central positions of shot regions 602a and 602b, as shown in FIG. 6D. For example, pieces of information B1 and B2 for shot regions 602a and 602b of a shot region array as shown in FIG. 6B are used as pieces of information for the standard region 652 and a standard region 653 including the central positions of the shot regions 602a and 602b, respectively, as shown in FIG. 6E.

Figure 6F:
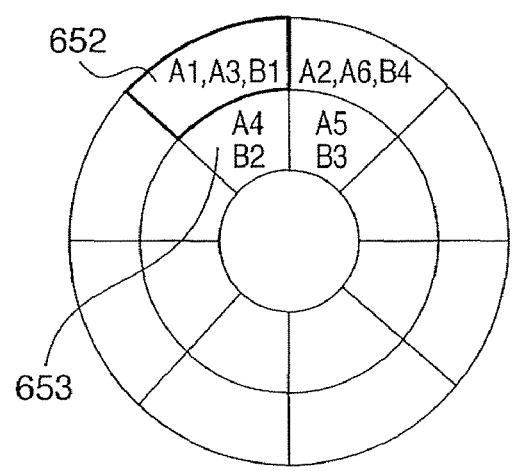

The converting unit 223 converts exposure apparatus information obtained by exposure according to the shot region array illustrated in FIG. 6A and that obtained by exposure according to the shot region array illustrated in FIG. 6B to obtain pieces of standard region information as shown in FIG. 6F. For the standard region 652, three pieces of information A1, A3, and B1 are obtained and can be statistically processed. For a standard region for which no information is obtained, it is possible to generate pieces of information based on pieces of standard region information for other standard regions, for example, its peripheral standard regions.

Figure 7:
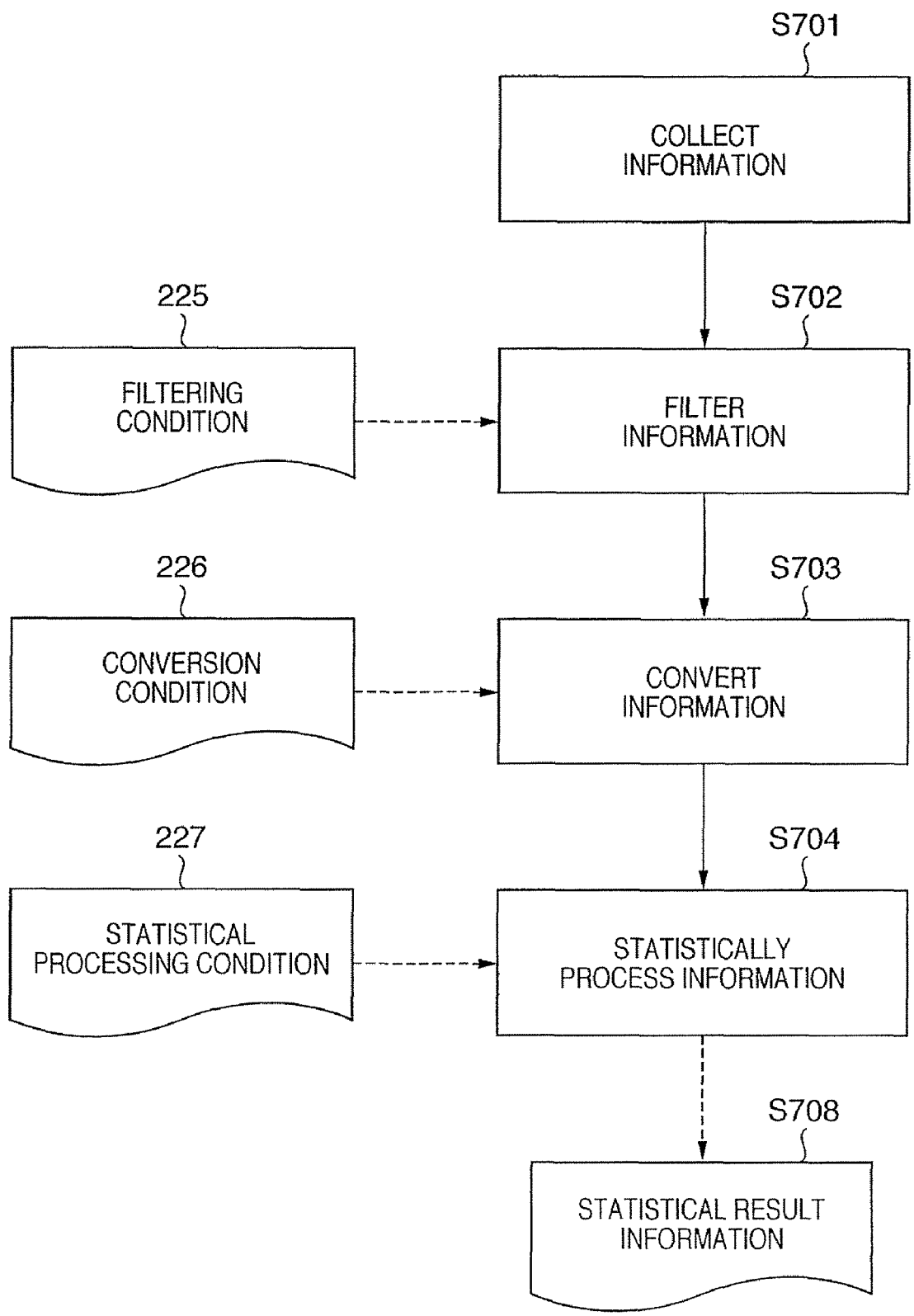
FIG. 7 is a flowchart illustrating the sequence of processing of analyzing design-dependent apparatus information (first apparatus information) according to the preferred embodiment of the present invention.

FIG. 7 is a flowchart illustrating the sequence of processing of analyzing design-dependent apparatus information (first apparatus information) by the information processing apparatus 202 shown in FIG. 2.

In step S701 (collection step), the information collecting unit 221 acquires design-dependent apparatus information from the exposure apparatus 100 via the communication interface 201 and the communication interface 17 of the exposure apparatus, and stores it in the database 231.

In step S702 (filtering step), the filtering unit 222 filters the design-dependent apparatus information stored in the database 231, in accordance with the filtering condition 225, thereby extracting necessary information. This is useful for analyzing the operation of the exposure apparatus under a designated condition. For example, extracting and statistically processing information for each scanning direction makes it possible to specify the operation of the exposure apparatus for each scanning direction and calculate a correction parameter for each scanning direction.

The filtering condition 225 can be set so as to extract at least one piece of information from pieces of information contained in exposure apparatus information. The filtering condition 225 can include a numerical value or numerical range if the information to be extracted contains a numerical value. The filtering condition 225 can include, for example, the scanning direction. The scanning direction can be defined as, for example, the up direction and down direction. The filtering condition 225 can be set via the input unit 232. An initial condition may be set to the filtering condition 225 in advance. The filtering condition 225 may be set even by selecting one of a plurality of conditions prepared in advance, as needed.

Figure 8:
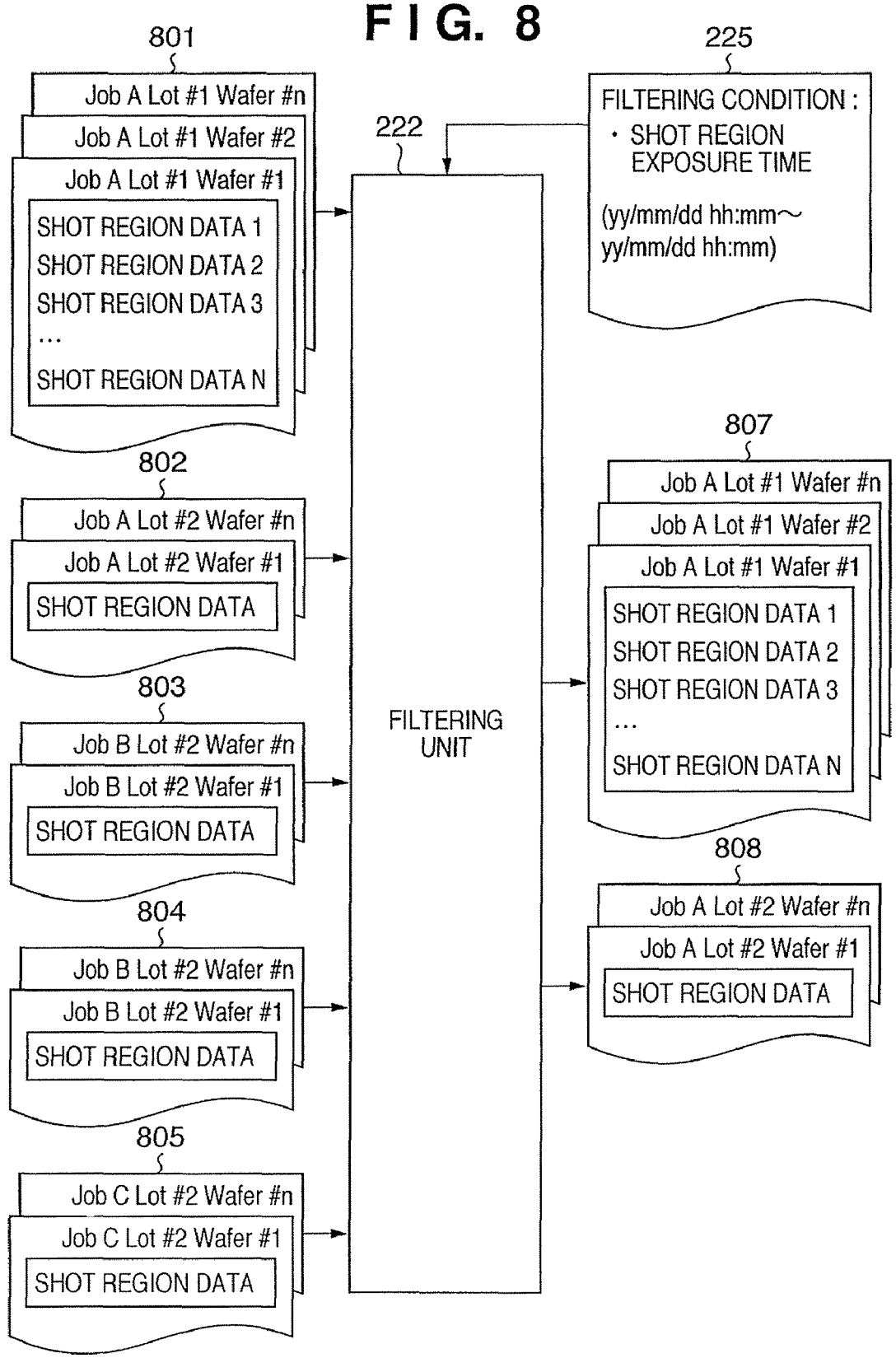
FIG. 8 is a view schematically showing an example of filtering processing by a filtering unit.

FIG. 8 is a view schematically showing an example of filtering processing by the filtering unit 222. Pieces of design-dependent apparatus information 801, 802, 803, 804, and 805 are obtained by exposing a plurality of lots. The information collecting unit 221 collects the pieces of design-dependent apparatus information 801, 802, 803, 804, and 805 in step S701.

The filtering unit 222 extracts information which meets a designated filtering condition 225 from each of the pieces of design-dependent apparatus information 801, 802, 803, 804, and 805. For example, if the shot region exposure time is set as the filtering condition, it is possible to designate the range of time to be extracted as the filtering condition. In this case, it is determined whether the exposure time of each shot region on each wafer falls within the time range designated as the filtering condition. Pieces of information 807 and 808 are extracted for a shot region exposed within the designated time range. If the filtering is not executed, all the design-dependent apparatus information stored in the database 231 is converted by the converting unit 223 and statistically processed by the statistical processing unit 224.

In step S703 (conversion step), the converting unit 223 converts the design-dependent apparatus information (first apparatus information) into standardized apparatus information (second apparatus information) in accordance with the designated conversion condition 226. The conversion condition 226 can be set via the input unit 232. An initial condition may be set to the conversion condition 226 in advance. The conversion condition 226 may be set even by selecting one of a plurality of conditions prepared in advance, as needed.

In step S704 (statistical processing step), the statistical processing unit 224 statistically processes pieces of standard region information contained in the standardized apparatus information obtained by the conversion processing in step S703 to output statistical result information 708. This statistical processing is typically done for each standard region.

The statistical processing condition 227 can be set via the input unit 232. An initial condition may be set to the statistical processing condition 227 in advance. The statistical processing condition 227 may be set even by selecting one of a plurality of conditions prepared in advance, as needed.

The statistical processing unit 224 calculates, for example, the maximum value, minimum value, average, and standard deviation as the statistical processing result.

The statistical processing unit 224 can execute the statistical processing for each item of, for example, the shot region exposure control information 323.

The statistical result information 708 can be output to various devices or apparatuses by various methods. The statistical result information 708 can be displayed by, for example, combining standard region array information. This makes it possible to assign different colors (e.g., tone levels) for the respective ranges of numerical values as the statistical result.

As described above, according to a preferred embodiment of the present invention, it is possible to know the state of the exposure apparatus based on design-dependent apparatus information obtained by various exposure jobs for manufacturing devices of various design patterns or exposure operations according to various shot region arrays.

An application example of the above-described embodiment will be explained below.

(Apparatus Threshold Value)

An optimal abnormality detection threshold value can be calculated for each standard region in accordance with a statistical processing result for each standard region. Assume, for example, that the synchronization accuracy or focus accuracy degrades at a specific position depending on the parameter setting or the characteristic of an exposure apparatus. Even in this case, according to a preferred embodiment of the present invention, it is possible to predict the specific position and the synchronization accuracy or focus accuracy at this position in accordance with a statistical processing result for each standard region and change the abnormality detection threshold value at this position.

(Process Threshold Value)

The synchronization accuracy or focus accuracy often degrades at a specific position depending on the process involved. This is presumably because the wafer surface state, a shot region located in the periphery of the wafer, a portion of a wafer, on which a foreign substance readily adheres upon a process of some kind, or the like change in each process. It is possible to predict the specific position and the synchronization accuracy or focus accuracy at this position in accordance with a statistical processing result for each standard region and change the abnormality detection threshold value at this position for each process.

(Threshold Value Transfer)

Figure 9:
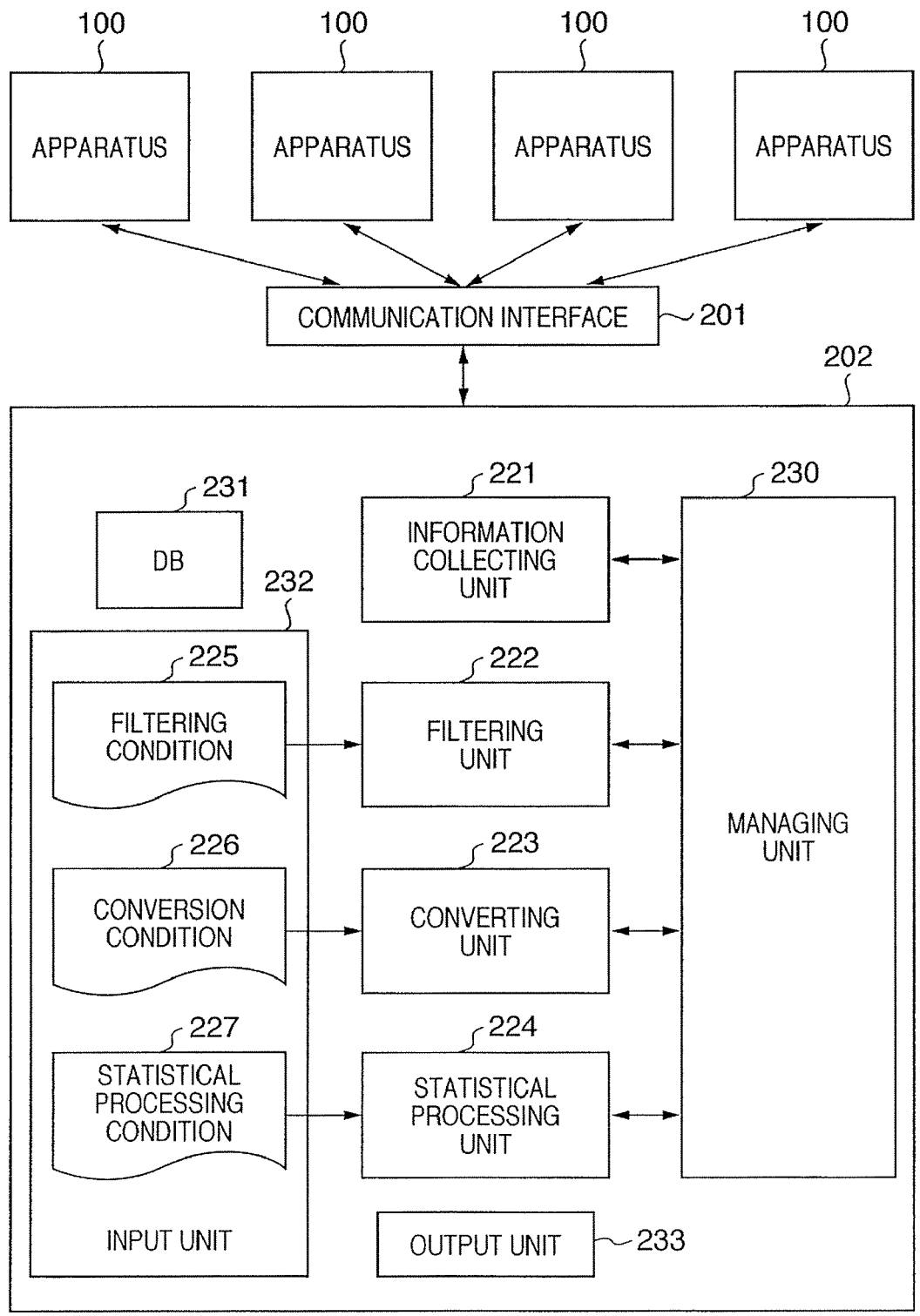
FIG. 9 is a block diagram showing an application example in which a managing system manages a plurality of exposure apparatuses.

FIG. 9 is a block diagram showing an application example in which a managing system manages a plurality of exposure apparatuses 100. An information processing apparatus (managing system) 202 manages the plurality of exposure apparatuses 100 based on design-dependent apparatus information provided from them. The managing system can inspect the variation between the plurality of exposure apparatuses 100 for each standard region. For example, the abnormality detection threshold value of a certain process for each standard region used in a certain exposure apparatus can be transferred to other exposure apparatuses by adding the apparatus variation for each standard region to the abnormality detection threshold value of the process for each standard region.

(Abnormality Feedback)

Figure 10:
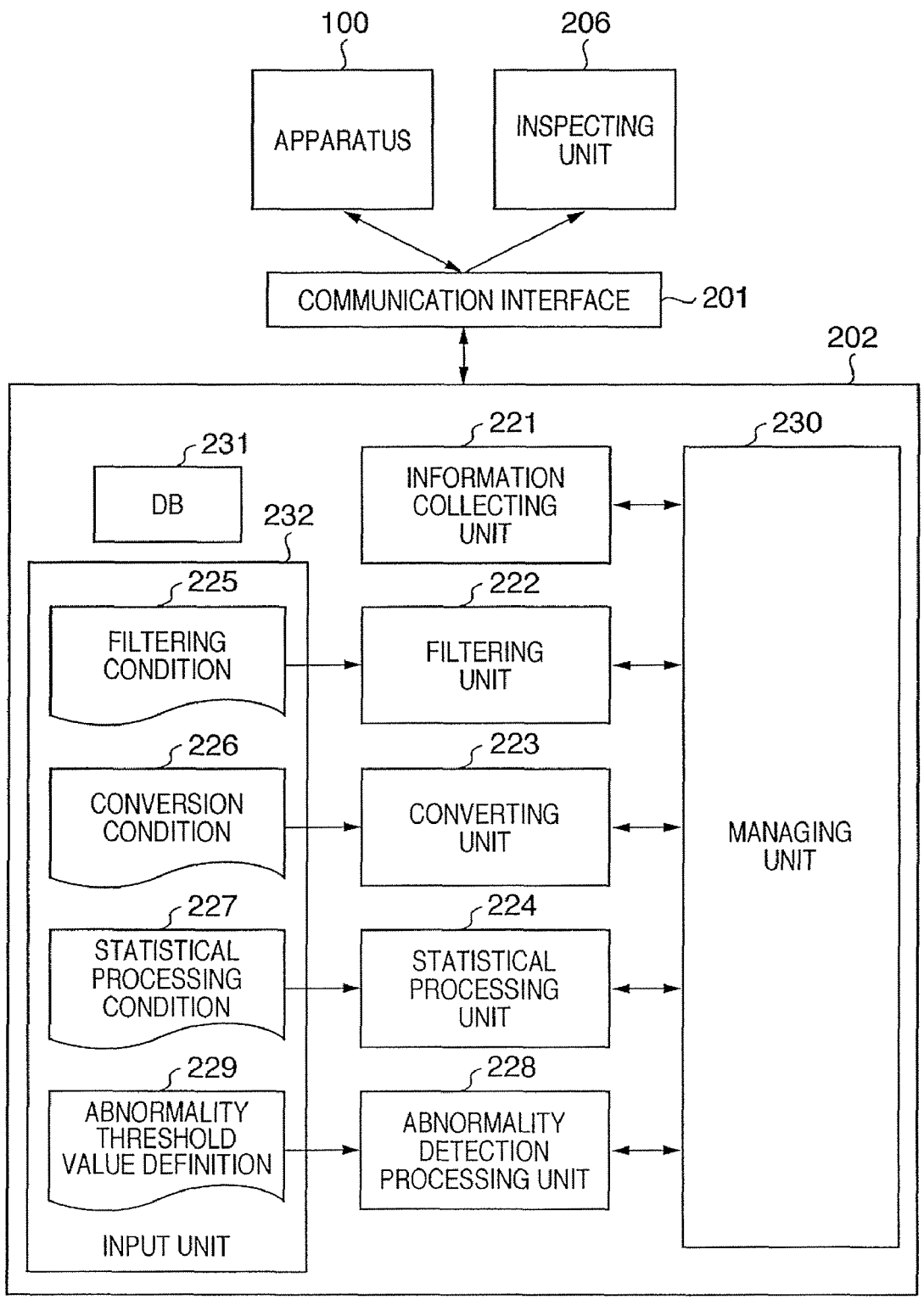
FIG. 10 is a block diagram showing an application example in which a managing system manages one or a plurality of exposure apparatuses and other apparatuses.

FIG. 10 is a block diagram showing an application example in which a managing system manages one or a plurality of exposure apparatuses 100 and other apparatuses. An information processing apparatus (managing system) 202 detects any abnormality for each standard region by an abnormality detection processing unit 228 in accordance with an abnormality inspection threshold value 229 determined for each standard region based on a statistical processing result for each standard region. The information processing apparatus 202 feeds back the abnormality detection result to an inspecting unit 206 via a communication interface 201. For example, the inspecting unit 206 selectively inspects a portion detected to suffer an abnormality, while it reduces the inspection measurement sampling number at a portion detected not to suffer any abnormality. This allows an efficient inspection process.

(Abnormality Cause Analysis)

An exposure apparatus often has a region in which the synchronization accuracy or focus accuracy degrades depending on the abnormality cause. It is possible to store, as a pattern, a statistical processing result for each standard region upon the occurrence of an abnormality in the past and compare the patterns by abnormality cause analysis, thereby specifying the abnormality cause.

(Feedback to Apparatus Setting)

If a certain region requires modification because it suffers a bad synchronization accuracy or focus accuracy, it is possible to feed back an abnormality detection result in this region to the apparatus setting so as to change an apparatus control parameter associated with the apparatus operation for this region. In this case, an optimal parameter may be calculated by comparing the apparatus control parameter with the states of identical regions in other apparatuses.

For example, statistical processing may be performed for each region by setting the scanning direction and scanning speed as the filtering condition so that the scanning direction offset or scanning speed is set based on a comparison between the regions or between identical regions in a plurality of apparatuses.

(Feedback to Process Setting)

If a certain region requires modification in a specific process because it suffers a bad synchronization accuracy or focus accuracy, it is possible to feed back an abnormality detection result in this region to the process setting so as to change a process parameter associated with the apparatus operation for this region. In this case, an optimal parameter may be calculated by comparing the process parameter with the states of identical regions in other apparatuses.

It is also possible to feed back an abnormality detection result in a certain region to the process setting so as to change the processing operation for this region in processes other than those which use an exposure apparatus.

(Long-Term Monitoring)

Figure 11:
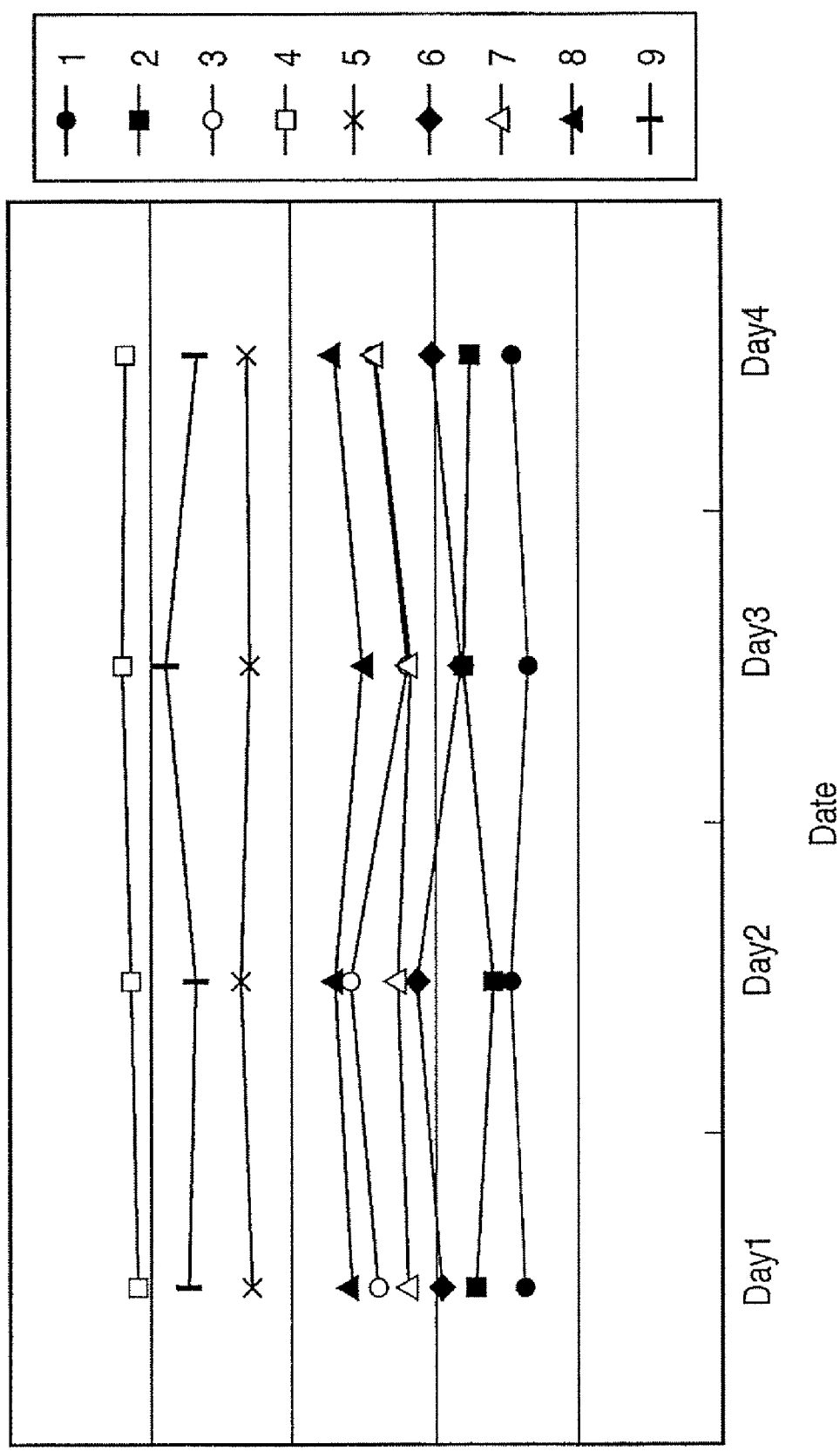
FIG. 11 is a graph showing long-term monitoring of a statistical processing result for each region.

As illustrated in FIG. 11, the statistical processing result of the synchronization accuracy or focus accuracy for each region is periodically recorded in a graph form and monitored. This makes it possible to detect an abnormality or predict an abnormality early based on the trend of a change in apparatus state.

(Re-Conversion)

Figure 12:
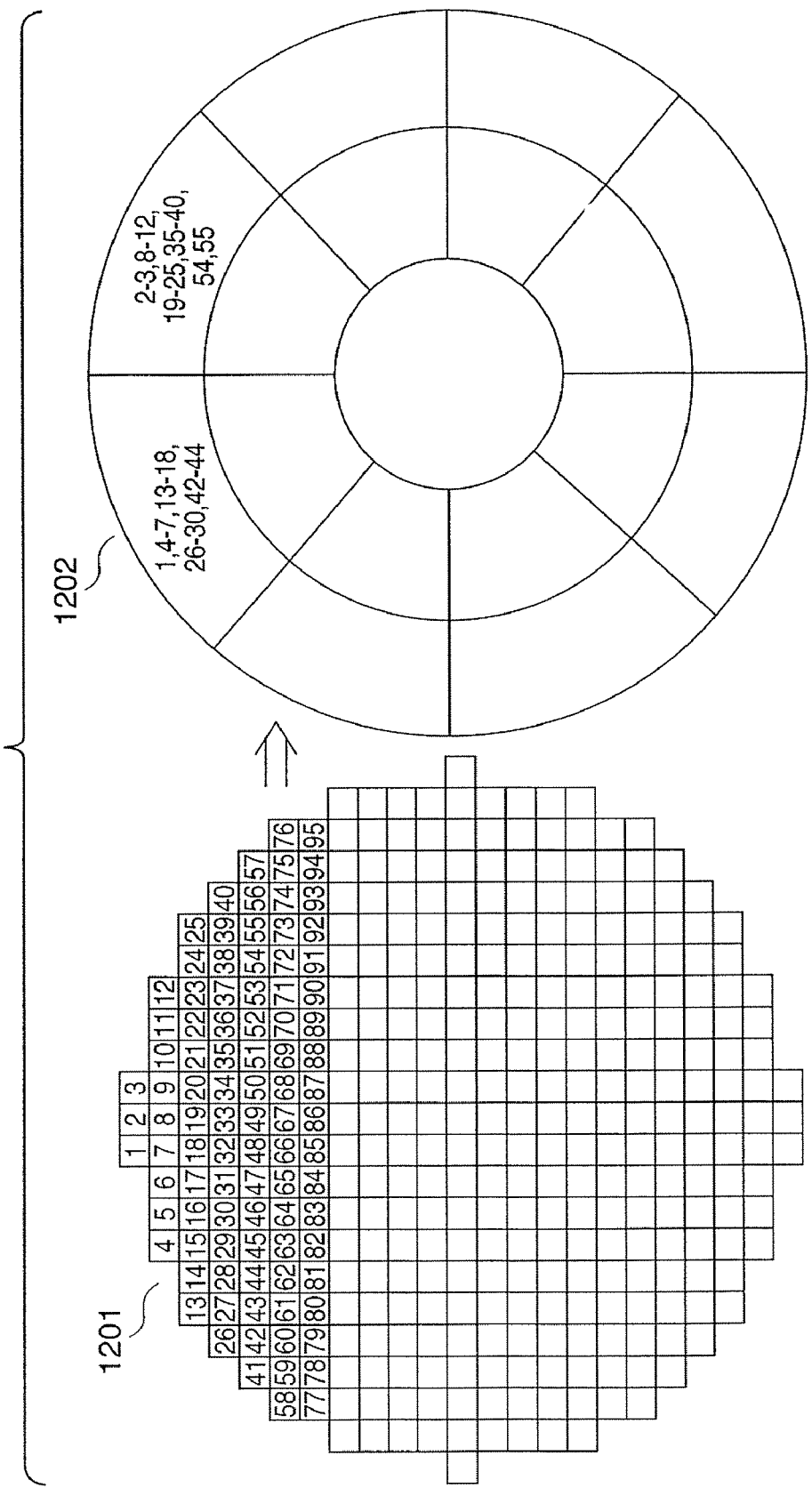
FIG. 12 is a view for explaining the re-conversion of apparatus information.

It is also possible to further convert standardized apparatus information 1201, which is converted in accordance with a standard region array as illustrated in FIG. 12, into standardized apparatus information 1202 according to another standard region array. The conversion method can be, for example, the above-described first or second example.

(Definition of Region Smaller Than Shot Region)

A region smaller than a shot region may be defined instead of generating information for each shot region in an exposure apparatus so that information is generated for each defined region.

(Re-Conversion to Process Shot Region Array)

Figure 13:
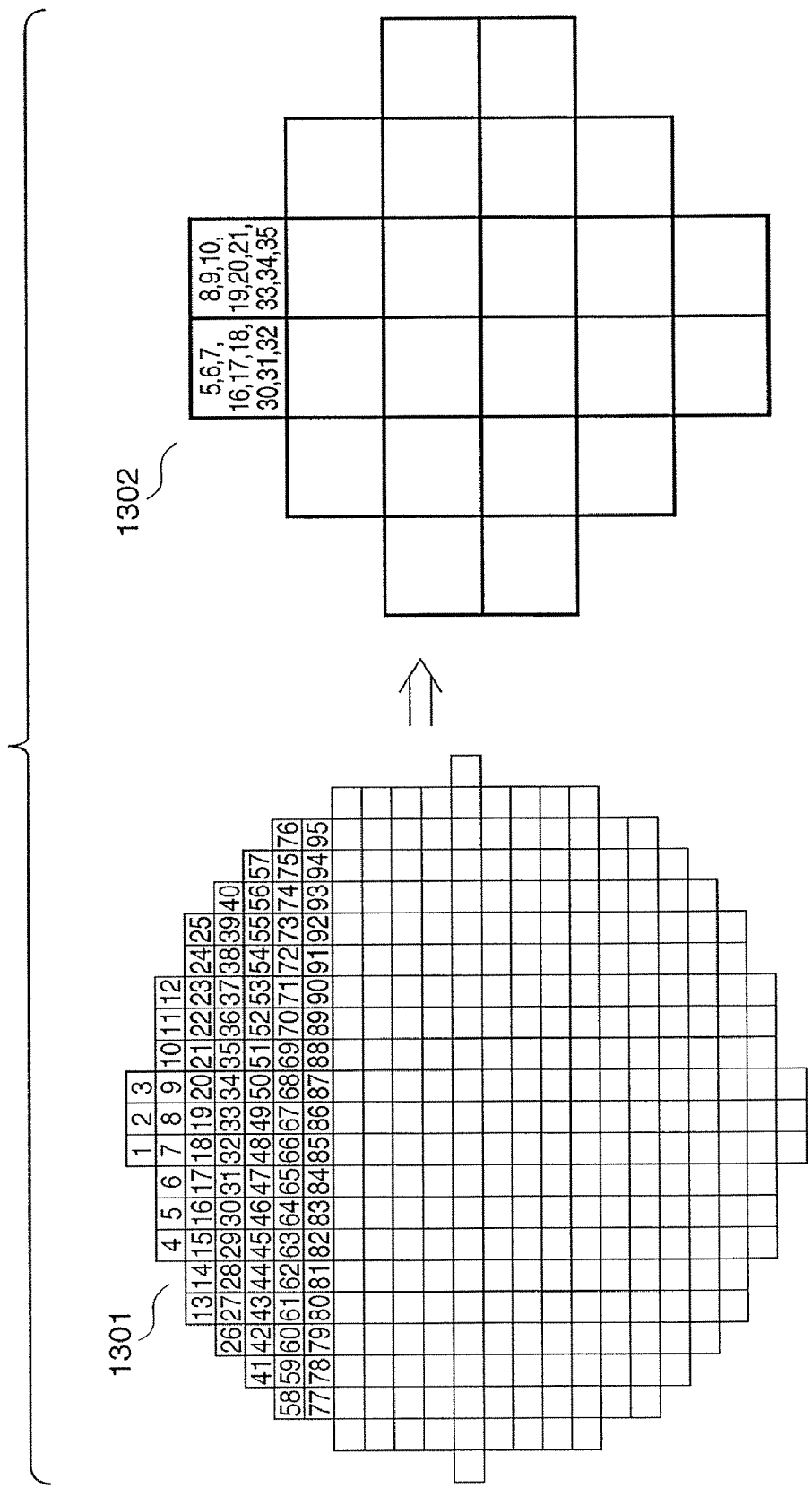
FIG. 13 is a view for explaining the re-conversion of apparatus information into a shot region array.

It is also possible to convert standardized apparatus information 1301 into apparatus information 1302 according to an arbitrary shot region array, as illustrated in FIG. 13. The conversion method can be, for example, the above-described first or second example.

Standardized apparatus information may be changed in accordance with the same array as a shot region array so that the focus accuracy or synchronization accuracy in a certain shot region is calculated based on the conversion result. An optimal parameter in this shot region may be calculated so that an abnormality detection result is fed back to the setting so as to change the control of an exposure apparatus based on this parameter. An abnormality detection result may be fed back to the setting so as to change the processing operation for this shot region in processes other than those which use an exposure apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An information processing apparatus for processing information generated by an exposure apparatus which exposes a substrate to radiant energy with respect to each of a plurality of first shot regions on the substrate, at least one device being to be manufactured from each of the plurality of first shot regions, the information processing apparatus comprising:
   a collecting unit configured to collect, from the exposure apparatus, first information obtained by the exposure apparatus with respect to each of a plurality of first regions which form a first array defined on the substrate via an exposure of each of the plurality of first shot regions, each of the plurality of first regions being equal to or smaller than a corresponding one of the plurality of first shot regions; and
   a converting unit configured to convert at least a part of the collected first information into standardized information defined with respect to each of a plurality of standard regions which form a standard array for use in evaluation of the exposure apparatus or the substrate,
   wherein each of the plurality of first shot regions includes at least one of the first regions, and
   wherein each of the plurality of first regions corresponds to at least one of the plurality of standard regions.

2. An apparatus according to claim 1, further comprising a filtering unit configured to extract information which meets a filtering condition from the collected first information,
   wherein the converting unit converts the extracted first information into the standardized information.

3. An apparatus according to claim 1, further comprising a statistical processing unit configured to statistically process the converted standardized information.

4. An apparatus according to claim 1, wherein
   the collecting unit is configured to collect second information, from the exposure apparatus, obtained by the exposure apparatus with respect to each of a plurality of second regions which form a second array defined on a second substrate via an exposure of each of a plurality of second shot regions on the second substrate, each of the second regions being equal to or smaller than a corresponding one of the second shot regions, and
   the converting unit is configured to convert at least a part of the collected second information into second standardized information defined with respect to each of a plurality of second standard regions,
   wherein each of the plurality of second shot regions includes at least one of the second regions, and
   wherein each of the plurality of second regions corresponds to at least one of the plurality of second standard regions.

5. An exposure system comprising:
   an exposure apparatus configured to expose a substrate to radiant energy; and
   an information processing apparatus as defined in claim 1 for processing information generated by the exposure apparatus.

6. A method of processing information generated by an exposure apparatus which exposes a substrate to radiant energy with respect to each of a plurality of first shot regions on the substrate, at least one device being to be manufactured from each of the plurality of first shot regions, the method comprising:
   a collection step of collecting, by a collecting unit, from the exposure apparatus, first information obtained by the exposure apparatus with respect to each of a plurality of first regions which form a first array defined on the substrate via an exposure of each of the plurality of first shot regions, each of the plurality of first regions being equal to or smaller than a corresponding one of the plurality of first shot regions; and
   a conversion step of converting, by a converting unit, at least a part of the collected first information into standardized information defined with respect each of a plurality of standard regions which form a standard array for use in evaluation of the exposure apparatus or the substrate,
   wherein each of the plurality of shot regions includes at least one of the first regions, and
   wherein each of the plurality of first regions corresponds to at least one of the plurality of standard regions.

7. A non-transitory computer-readable medium containing computer instructions stored therein for causing a computer processor to perform a process of processing information generated by an exposure apparatus which exposes a substrate to radiant energy with respect to each of a plurality of first shot regions on the substrate, at least one device being to be manufactured from each of the plurality of first shot regions, the process comprising:
   a collection step of collecting, from the exposure apparatus, first information obtained by the exposure apparatus with respect to each of a plurality of first regions which form a first array defined on the substrate via an exposure of each of the plurality of first shot regions, each of the plurality of first regions being equal to or smaller than a corresponding one of the plurality of first shot regions; and
   a conversion step of converting at least a part of the collected first information into standardized information defined with respect to each of a plurality of standard regions which form a standard array for use in evaluation of the exposure apparatus or the substrate,
   wherein each of the plurality of first shot regions includes at least one of the first regions, and
   wherein each of the plurality of first regions corresponds to at least one of the plurality of standard regions.

* * * * *